United States Patent
Ando

(10) Patent No.: US 11,101,309 B2
(45) Date of Patent: Aug. 24, 2021

(54) IMAGING ELEMENT, METHOD FOR MANUFACTURING IMAGING ELEMENT, AND ELECTRONIC DEVICE

(71) Applicant: SONY SEMICONDUCTOR SOLUTIONS CORPORATION, Kanagawa (JP)

(72) Inventor: Yukihiro Ando, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 16/757,455

(22) PCT Filed: Sep. 19, 2018

(86) PCT No.: PCT/JP2018/034599
§ 371 (c)(1),
(2) Date: Apr. 20, 2020

(87) PCT Pub. No.: WO2019/082559
PCT Pub. Date: May 2, 2019

(65) Prior Publication Data
US 2021/0183916 A1 Jun. 17, 2021

(30) Foreign Application Priority Data
Oct. 27, 2017 (JP) .............................. JP2017-208038

(51) Int. Cl.
*H01L 27/146* (2006.01)
*H01L 23/00* (2006.01)
(52) U.S. Cl.
CPC .......... *H01L 27/1462* (2013.01); *H01L 24/05* (2013.01); *H01L 27/14636* (2013.01);
(Continued)

(58) Field of Classification Search
CPC ........ H01L 27/11807; H01L 21/8238–823892; H01L 27/092–0928;
(Continued)

(56) References Cited

U.S. PATENT DOCUMENTS 8,659,060 B2 * 2/2014 Koike ............... H01L 27/14638
257/292
2005/0090035 A1 4/2005 Kim
(Continued)

FOREIGN PATENT DOCUMENTS

| JP | 2005-129952 | 5/2005 |
| JP | 2010-109137 | 5/2010 |
| JP | 2018-011018 | 1/2018 |

OTHER PUBLICATIONS

International Search Report and Written Opinion prepared by the Japanese Patent Office dated Nov. 22, 2018, for International Application No. PCT/JP2018/034599.

*Primary Examiner* — Jonathan Han
(74) *Attorney, Agent, or Firm* — Sheridan Ross P.C.

(57) ABSTRACT

A photoelectric conversion unit that outputs an image signal according to received light and a bonding pad section are disposed on one surface side of the substrate, and the bonding pad section has at least: a first opening provided to expose a pad electrode at a bottom; and a second opening that is arranged to surround the first opening and that is shallower than the first opening. The surface of a terrace in the bonding pad section is formed such that multiple types of materials are exposed.

15 Claims, 15 Drawing Sheets

(52) U.S. Cl.
CPC ........ *H01L 27/14685* (2013.01); *H01L 24/48* (2013.01); *H01L 27/14618* (2013.01); *H01L 2224/04042* (2013.01); *H01L 2224/04105* (2013.01); *H01L 2224/05569* (2013.01); *H01L 2224/48227* (2013.01); *H01L 2224/48463* (2013.01)

(58) Field of Classification Search
CPC ...... H01L 2027/11809–11894; H01L 27/1462; H01L 24/05; H01L 27/14636; H01L 27/14685; H01L 24/48; H01L 27/14618; H01L 2224/04042; H01L 2224/04105; H01L 2224/05569; H01L 2224/48227; H01L 2224/48463; H01L 27/14; H01L 25/167; H01L 31/107; H01L 27/14643–14663; B81C 2203/0714; B81C 2203/0728; B81C 2203/0735; B81C 2203/0742

USPC ........................................................ 257/459
See application file for complete search history.

(56) References Cited

U.S. PATENT DOCUMENTS

| | | | |
|---|---|---|---|
| 2010/0109006 A1* | 5/2010 | Kobayashi | H01L 27/14636 257/48 |
| 2010/0237452 A1* | 9/2010 | Hagiwara | H01L 21/76898 257/432 |
| 2014/0225215 A1* | 8/2014 | Chien | H01L 24/05 257/447 |
| 2015/0311247 A1* | 10/2015 | Chen | H01L 27/1463 257/432 |

* cited by examiner

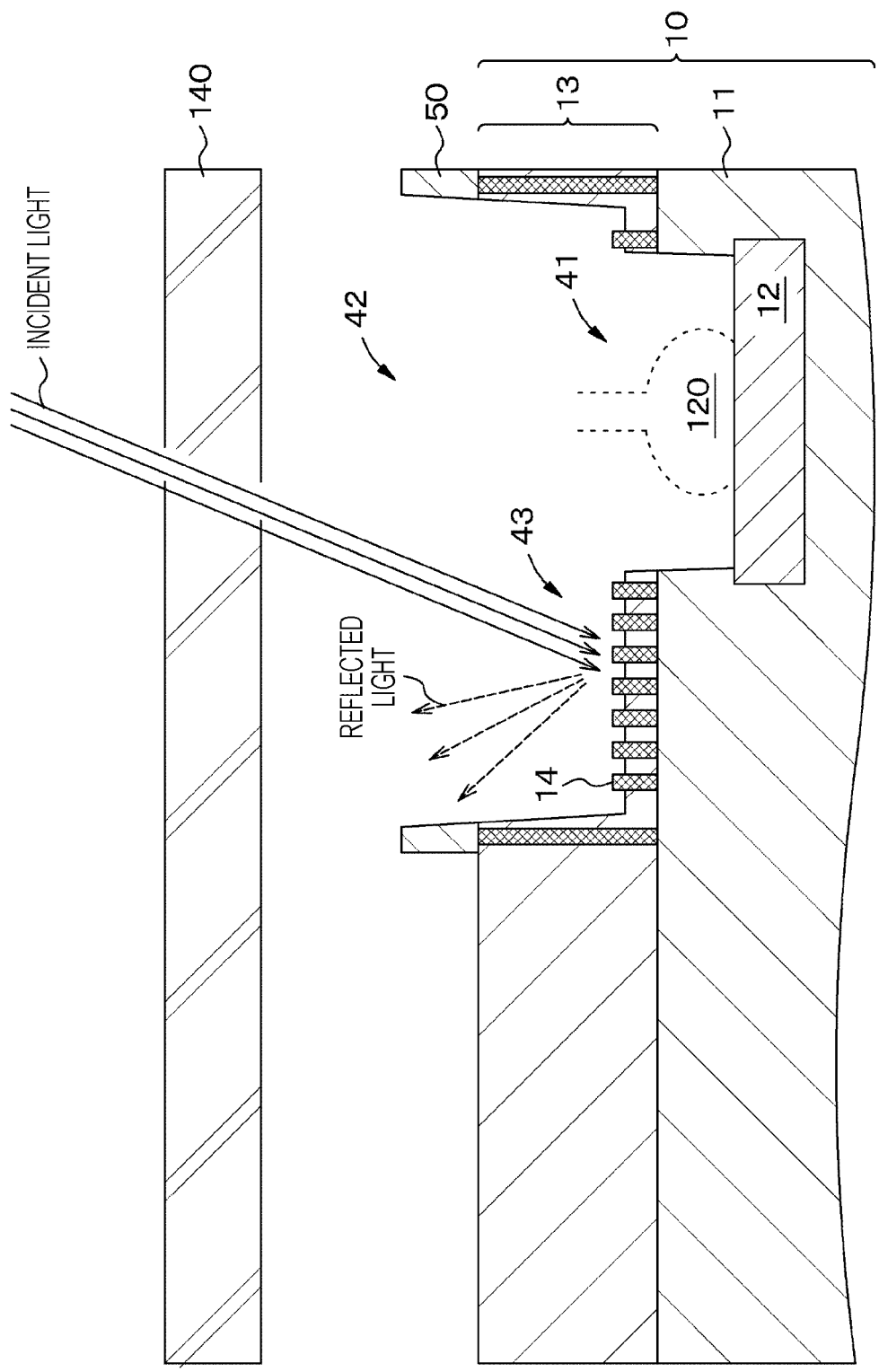

IMAGING ELEMENT, METHOD FOR MANUFACTURING IMAGING ELEMENT, AND ELECTRONIC DEVICE

CROSS REFERENCE TO RELATED APPLICATIONS

This application is a national stage application under 35 U.S.C. 371 and claims the benefit of PCT Application No. PCT/JP2018/034599 having an international filing date of 19 Sep. 2018, which designated the United States, which PCT application claimed the benefit of Japanese Patent Application No. 2017-208038 filed 27 Oct. 2017, the entire disclosures of each of which are incorporated herein by reference.

TECHNICAL FIELD

The present disclosure relates to an imaging element, a method for manufacturing an imaging element, and an electronic device. In particular, the present invention relates to an imaging element capable of reducing a flare caused by light reflection at a pad opening, a method for manufacturing the imaging element, and an electronic device including the imaging element.

BACKGROUND ART

In recent years, imaging elements such as a charge coupled device (CCD) sensor and a complementary metal oxide semiconductor (CMOS) sensor have been used in camera systems. These elements are generally configured by mounting a semiconductor substrate provided with a photoelectric conversion unit and the like on a package substrate. The semiconductor substrate and the package substrate are electrically connected using so-called wire bonding.

In wire bonding, a pad opening formed in the semiconductor substrate and an electrode of the package substrate are connected with a wire by a wire bonding machine having a capillary through which a wire passes. In a case where the pad opening of the semiconductor substrate is formed deep, a problem of a contact between the capillary and the edge of the opening may occur during a bonding step. In view of this, it has been proposed to provide a shallow opening around the pad opening (for example, see Japanese Patent Application Laid-Open No. 05-95097 (Patent Document 1)).

CITATION LIST

Patent Document

Patent Document 1: Japanese Patent Application Laid-Open No. 05-95097

SUMMARY OF THE INVENTION

Problems to be Solved by the Invention

In a structure in which a shallow opening is provided around the pad opening, light is reflected at the bottom surface of the shallow opening. Since a seal glass is usually arranged on the photoelectric conversion unit side of the semiconductor substrate, it is considered that light reflected on the bottom surface of the opening is further reflected by the seal glass and reaches the photoelectric conversion unit to generate a flare.

Therefore, an object of the present invention is to provide an imaging element capable of reducing a flare due to reflection of light at the bottom surface of a shallow opening, a method for manufacturing the imaging element, and an electronic device including the imaging element.

Solutions to Problems

An imaging element according to a first aspect of the present disclosure to achieve the above object includes
a photoelectric conversion unit that outputs an image signal according to received light and a bonding pad section, the photoelectric conversion unit and the bonding pad section being disposed on one surface side of a substrate,
in which the bonding pad section has at least
a first opening provided to expose a pad electrode at a bottom, and
a second opening that is arranged to surround the first opening and that is shallower than the first opening, and
a surface of a terrace in the bonding pad section is formed such that multiple types of materials are exposed.

A method for manufacturing an imaging element according to the first aspect of the present disclosure to achieve the above object is a method for manufacturing an imaging element that includes
a photoelectric conversion unit that outputs an image signal according to received light and a bonding pad section, the photoelectric conversion unit and the bonding pad section being disposed on one surface side of a substrate,
the bonding pad section having at least
a first opening provided to expose a pad electrode at a bottom, and
a second opening that is arranged to surround the first opening and that is shallower than the first opening, the method including:
a step of placing the photoelectric conversion unit to be provided in a semiconductor material layer on the substrate;
a step of forming a trench in a portion of the semiconductor material layer corresponding to the second opening;
a step of embedding a material different from a material constituting the semiconductor material layer in the trench in the semiconductor material layer;
a step of forming the first opening; and
a step of forming the second opening.

An electronic device according to the first aspect of the present disclosure to achieve the above object is an electronic device including an imaging element,
in which the imaging element includes a photoelectric conversion unit that outputs an image signal according to received light and a bonding pad section, the photoelectric conversion unit and the bonding pad section being disposed on one surface side of a substrate,
the bonding pad section has at least
a first opening provided to expose a pad electrode at a bottom, and
a second opening that is arranged to surround the first opening and that is shallower than the first opening, and
a surface of a terrace in the bonding pad section is formed such that multiple types of materials are exposed.

BRIEF DESCRIPTION OF DRAWINGS

FIG. 6 is a schematic partial sectional view for describing reflection of light in the imaging element mounted on a package substrate according to the first embodiment.

MODE FOR CARRYING OUT THE INVENTION

Figure 1:
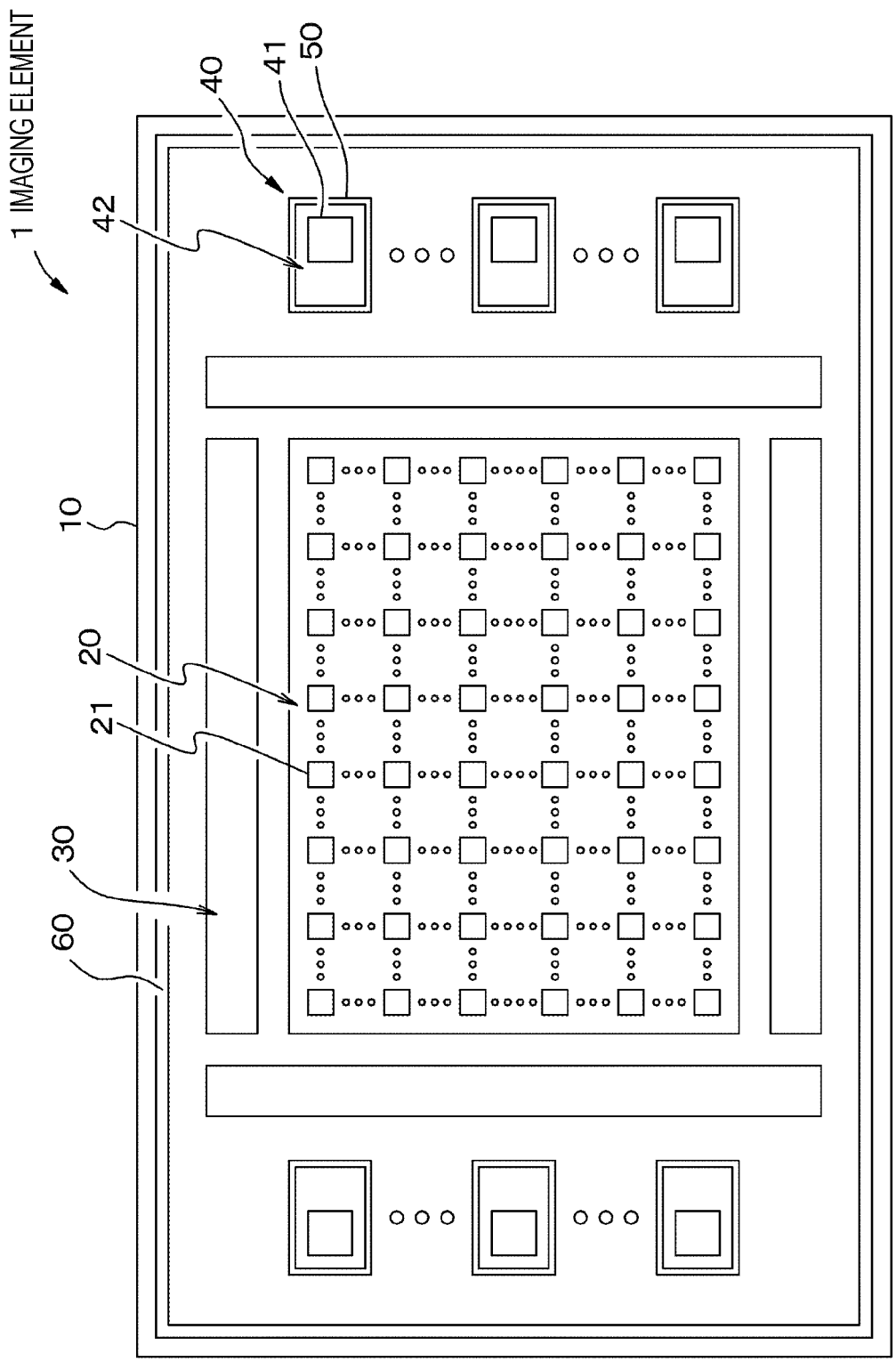
FIG. 1 is a schematic plan view of an imaging element according to a first embodiment.

Hereinafter, the present disclosure will be described on the basis of embodiments with reference to the drawings. The present disclosure is not limited to the embodiments, and various numerical values and materials in the embodiments are illustrative. In the following description, the same reference numerals are used for the same elements or elements having the same function, and redundant description is omitted. Note that the description will be given in the following order.

1. Overall description of an imaging element, a method for manufacturing an imaging element, and an electronic device according to the present disclosure
2. First Embodiment
3. Second Embodiment
4. Third Embodiment
5. Application example
6. Others

[Overall Description of an Imaging Element, a Method for Manufacturing an Imaging Element, and an Electronic Device According to the Present Disclosure]

As described above, each of an imaging element according to the first aspect of the present disclosure, an imaging element manufactured by a method for manufacturing an imaging element according to the first aspect of the present disclosure, and an imaging element used for an electronic device according to the first aspect of the present disclosure (hereinafter, the imaging elements described above may be merely referred to as the "imaging element according to the present disclosure" in some cases) includes a photoelectric conversion unit that outputs an image signal according to received light and a bonding pad section, the photoelectric conversion unit and the bonding pad section being disposed on one surface side of a substrate, in which the bonding pad section has at least a first opening provided to expose a pad electrode at a bottom, and a second opening that is arranged to surround the first opening and that is shallower than the first opening, and a surface of a terrace in the bonding pad section is formed such that multiple types of materials are exposed.

In the imaging element according to the present disclosure, the surface of the terrace in the bonding pad section may be formed such that multiple types of materials having different refractive indexes are exposed.

In the imaging element according to the present disclosure including the above-described preferred configuration, at least one of the multiple types of materials may be exposed in a spaced dot pattern, a spaced line pattern, or a matrix pattern on the surface of the terrace in the bonding pad section.

In the imaging element according to the present disclosure including the above-described preferred configurations, a portion where the multiple types of materials are exposed may be formed to have different heights for each material on the surface of the terrace in the bonding pad section.

In this case, the portion where the multiple types of materials are exposed may be formed such that a portion having a low refractive index protrudes on the surface of the terrace in the bonding pad section. Alternatively, the portion where the multiple types of materials are exposed may be formed such that a portion having a high refractive index protrudes on the surface of the terrace in the bonding pad section.

In the imaging element according to the present disclosure including the various preferable configurations described above, the substrate may include a semiconductor material layer, and a portion including a semiconductor material layer and a portion including a material different from a material constituting the semiconductor material layer may be formed to be exposed on the surface of the terrace in the bonding pad section. In this case, the semiconductor material layer may include a silicon layer, and a portion including the silicon layer, a portion including silicon oxide, and/or a portion including silicon nitride may be formed to be exposed on the surface of the terrace in the bonding pad section.

As described above, the method for manufacturing an imaging element according to the first aspect of the present disclosure is a method for manufacturing an imaging element that includes a photoelectric conversion unit that outputs an image signal according to received light and a bonding pad section, the photoelectric conversion unit and the bonding pad section being disposed on one surface side of a substrate, the bonding pad section having at least a first opening provided to expose a pad electrode at a bottom, and a second opening that is arranged to surround the first opening and that is shallower than the first opening, the method including:

a step of placing the photoelectric conversion unit to be provided in a semiconductor material layer on the substrate;

a step of forming a trench in a portion of the semiconductor material layer corresponding to the second opening;

a step of embedding a material different from a material constituting the semiconductor material layer in the trench in the semiconductor material layer;

a step of forming the first opening; and a step of forming the second opening.

In this case, the method may further include a step of thinning a surface of the semiconductor material layer on a side of a photodiode that constitutes the photoelectric conversion unit after the photoelectric conversion unit is formed in the semiconductor material layer.

In this case, the step of forming a trench in a portion of the semiconductor material layer corresponding to the second opening and the step of embedding a material different from a material constituting the semiconductor material layer in the trench of the semiconductor material layer may be performed after the step of thinning the surface of the semiconductor material layer. Alternatively, the step of forming a trench in a portion of the semiconductor material layer corresponding to the second opening and the step of embedding a material different from a material constituting the semiconductor material layer in the trench of the semiconductor material layer may be performed before the step of thinning the surface of the semiconductor material layer.

The imaging element according to the present disclosure can be manufactured using, for example, a substrate obtained by laminating a plurality of semiconductor wafers including silicon or the like, a plurality of pseudo wafers on which a wiring layer or the like is formed, and the like. A driving circuit or the like for driving the photoelectric conversion unit may be formed integrally with or separately from the substrate.

In the present disclosure, the configuration of the photoelectric conversion unit is not particularly limited. The photoelectric conversion unit includes pixels which are two-dimensionally arrayed in a matrix, the pixels each including a combination of a photoelectric conversion element including, for example, a photodiode (PD) or the like, a floating diffusion region (FD) to which photoelectrically converted charges are transferred, and a plurality of transistors. Signals output from the pixels are subjected to analog to digital (A/D) conversion in parallel by a plurality of A/D converters arranged for each column of pixels, and are output as digital signals, for example.

The imaging element may be configured to capture a monochrome image or may be configured to capture a color image. In a case where the imaging element is configured to capture a color image, a color filter is usually arranged on the light incident surface side of the photoelectric conversion unit. For example, in a case where a color image of a Bayer arrangement is captured, a color image is captured using a group of photoelectric conversion elements corresponding to [red, green, green, blue].

Some of resolutions for image display such as (3840, 2160) and (7680, 4320) as well as U-XGA (1600, 1200), HD-TV (1920, 1080), and Q-XGA (2048, 1536) can be presented as values of pixels of the imaging device. However, resolutions are not limited to these values.

Further, various electronic devices including an imaging system such as a digital still camera and a digital video camera, a mobile phone having an imaging function, and another device having an imaging function can be presented as the electronic device including the imaging element according to the present disclosure.

Various conditions herein are satisfied not only in a case where they are mathematically established in a strict sense but also in a case where they are substantially established. Various variations resulting from the design or manufacture are allowable. Moreover, each drawing used in the following description is schematic and does not show actual dimensions and ratios thereof. For example, FIG. 6, which will be described later, shows a sectional structure in the vicinity of a bonding pad section in an imaging element, but does not show the ratio of width, height, thickness, and the like.

First Embodiment

The first embodiment relates to an imaging element according to a first aspect of the present disclosure.

FIG. 1 is a schematic plan view of the imaging element according to the first embodiment.

The imaging element 1 is manufactured in such a way that multiple imaging elements 1 are arrayed on, for example, a circular plate, and separated by dicing. Reference sign 60 denotes a guard ring around the individual imaging element.

In the imaging element 1, a photoelectric conversion unit 20 that outputs an image signal corresponding to received light and a bonding pad section 40 are formed on one surface side of a substrate 10.

The photoelectric conversion unit 20 is configured such that pixels are two-dimensionally arrayed in a matrix, each pixel including a photoelectric conversion element including a photodiode and the like.

Driving circuits (for example, a horizontal driving circuit, a vertical driving circuit, a column signal processing circuit, and a control circuit) for driving the pixels are disposed in a surrounding region 30 all around the photoelectric conversion unit 20.

The bonding pad sections 40 are arranged in line at the end of the imaging element 1. In the example shown in FIG. 1, the bonding pad sections 40 are arranged along the right side and the left side of the imaging element 1, but this is merely an example. Reference sign 50 denotes a guard ring arranged around each bonding pad section 40.

Each of the bonding pad sections 40 includes at least a first opening 41 provided so that a pad electrode (indicated by reference sign 12 in FIG. 5B described later) is exposed at the bottom, and a second opening 42 which is arranged to surround the first opening 41 and which is shallower than the first opening 41. As will be described later in detail with reference to FIGS. 5, 11A, and 12A, which will be described later, the surface of a terrace in the bonding pad section 40 is formed such that multiple types of materials are exposed.

Figure 2:
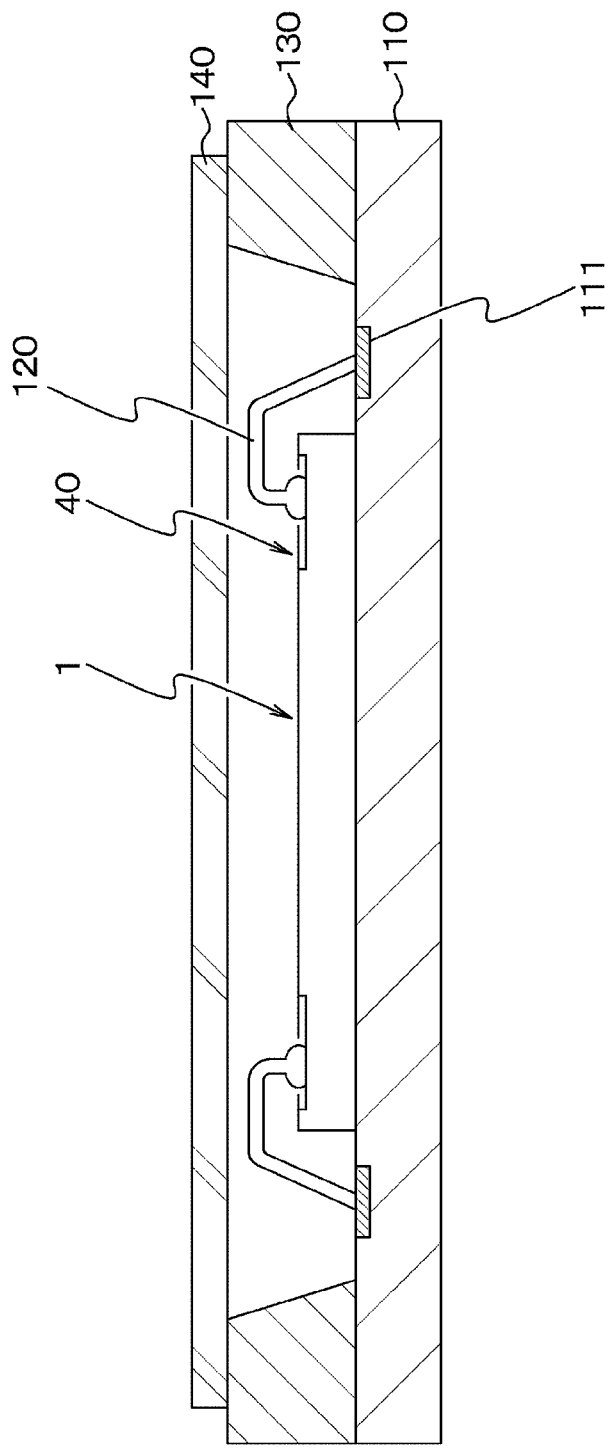
FIG. 2 is a schematic sectional view for describing the imaging element mounted on a package substrate.

FIG. 2 is a schematic sectional view for describing the imaging element mounted on a package substrate.

The imaging element 1 is mounted on a package substrate 110, and a seal glass 140 is disposed thereon. External light is incident on the photoelectric conversion unit 20 of the imaging element 1 via the seal glass 140. Reference sign 130 denotes a sealing material for sealing the seal glass 140 to the package substrate. Terminals 111 of the package substrate 110 and the bonding pad sections 40 of the imaging element 1 are electrically connected by wires 120. Note that, although various wirings to be connected to external terminals (not shown) are provided in the package substrate 110, they are not shown for convenience of illustration.

Here, in order to help the understanding of the present disclosure, reflection of external light in an imaging element according to a reference example in which a single material is exposed on the surface of a terrace and problems caused by such reflection will be described with reference to FIGS. 3 and 4.

Figure 3A:
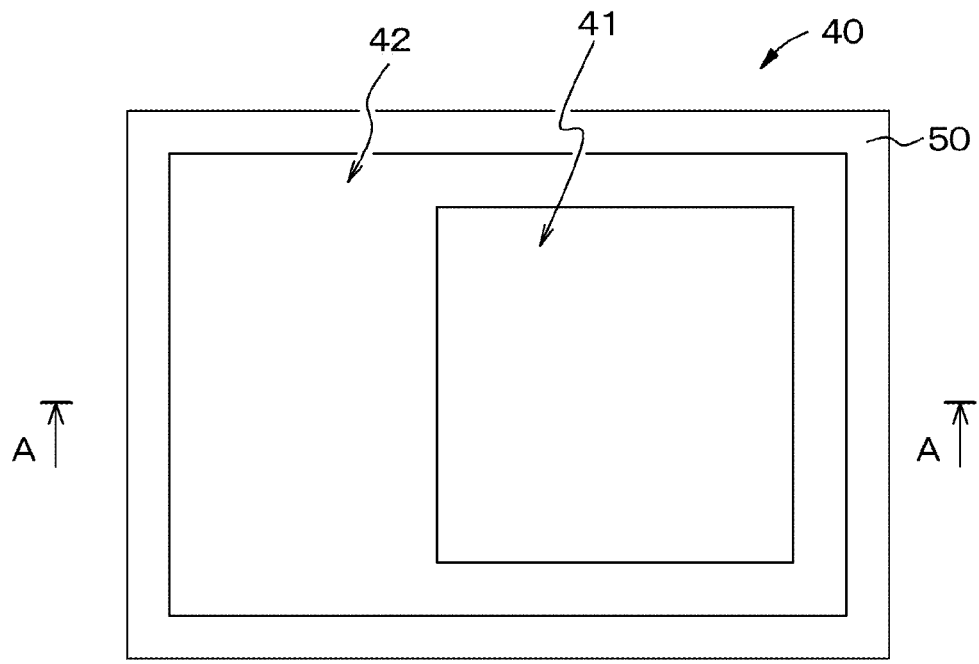
FIG. 3A is a schematic plan view of an electrode pad section in an imaging element according to a reference example.
Figure 3B:
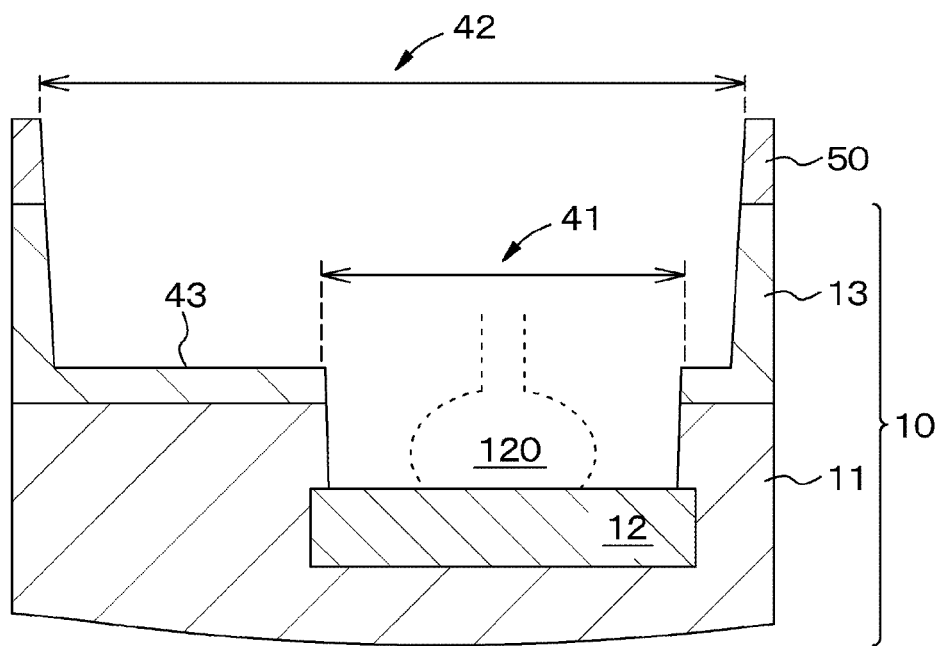
FIG. 3B is a schematic sectional view of a region taken along a line A-A in FIG. 3A.

FIG. 3A is a schematic plan view of an electrode pad section in the imaging element according to the reference example. FIG. 3B is a schematic sectional view of a region taken along a line A-A in FIG. 3A.

The substrate 10 has a laminated structure. Reference sign 11 denotes a portion of an insulating layer in which, for example, a wiring (not shown) is formed. The pad electrode 12 includes, for example, a conductive material such as aluminum, and is arranged so as to be embedded in the insulating layer 11. Reference sign 13 denotes a semiconductor material layer, more specifically, a silicon layer.

The first opening 41 is provided such that the pad electrode 12 is exposed at the bottom. The second opening 42 is formed so as to surround the first opening 41, and is shallower than the first opening 41. More specifically, the first opening 41 is opened so as to partially leave the silicon layer 13, and the surface of the silicon layer 13 is exposed at a terrace 43 of the first opening 41. The wire 120 shown in FIG. 2 is connected on the pad electrode 12. For convenience of illustration, a portion of the wire is indicated by a broken line in FIG. 3B. The similar applies to FIGS. 4 and 6 described later.

Figure 4:
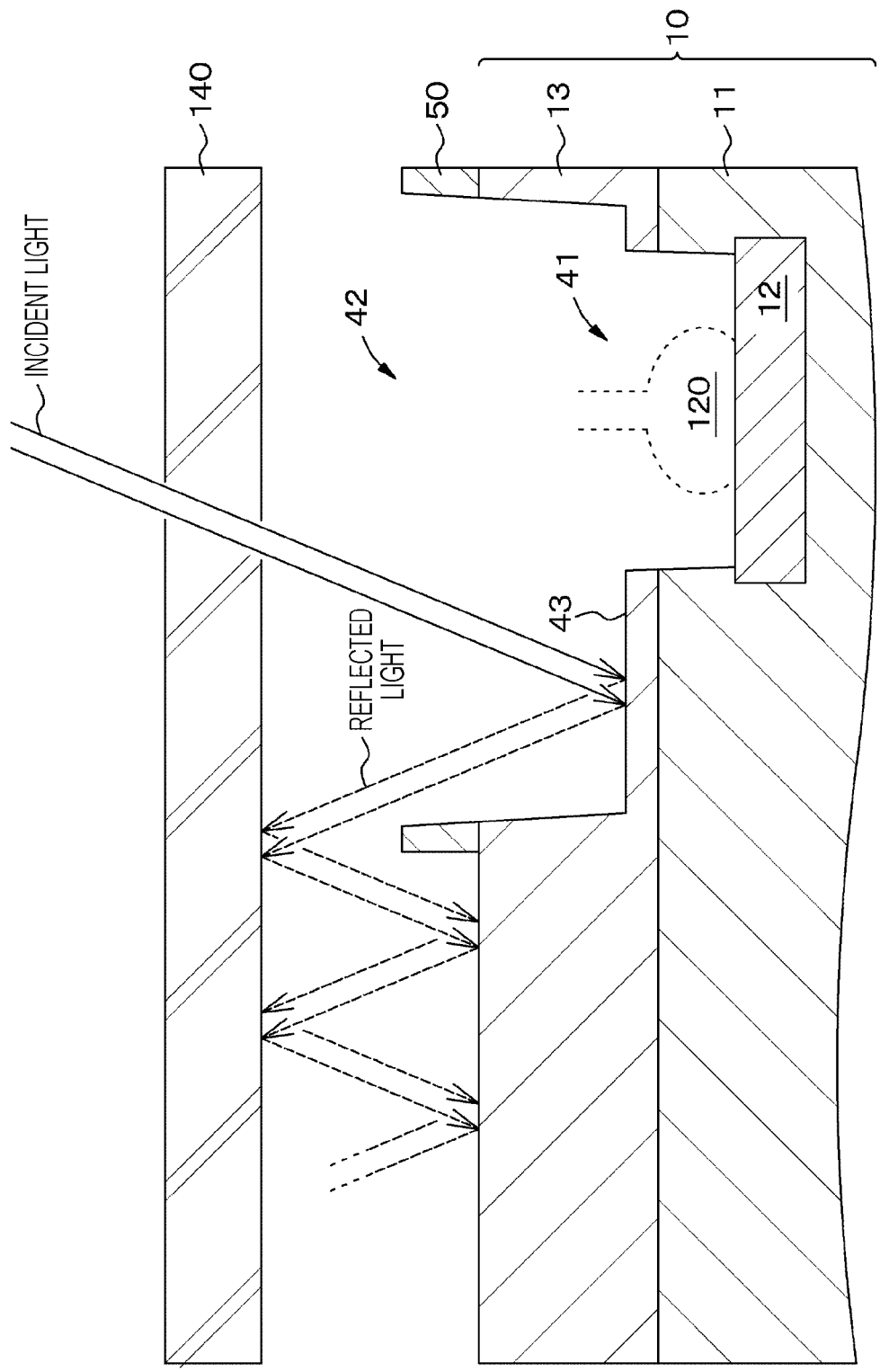
FIG. 4 is a schematic partial sectional view for describing reflection of light in the imaging element mounted on a package substrate according to the reference example.

FIG. 4 is a schematic partial sectional view for describing reflection of light in the imaging element mounted on a package substrate according to the reference example.

External light passes through the seal glass 140 and enters the imaging element. At this time, when external light enters the pad opening, specular reflection occurs on the surface of the terrace 43. When the light reflected on the terrace 43 is repeatedly reflected on the surface of the seal glass 140 and the surface of the imaging element again, the photoelectric conversion unit is affected by the reflected light, and a flare is generated.

The reflection of external light and the problem caused by such reflection in the imaging element according to the reference example in which a single material is exposed on the surface of the terrace have been described above.

In the present disclosure, in view of the above point, the surface of the terrace in the bonding pad section 40 is formed such that multiple types of materials are exposed. Since light incident on the surface of the terrace is diffused and reflected, the reflected light does not readily reach the photoelectric conversion unit. Therefore, a flare caused by light reflection on the surface of the terrace can be reduced.

Figure 5A:
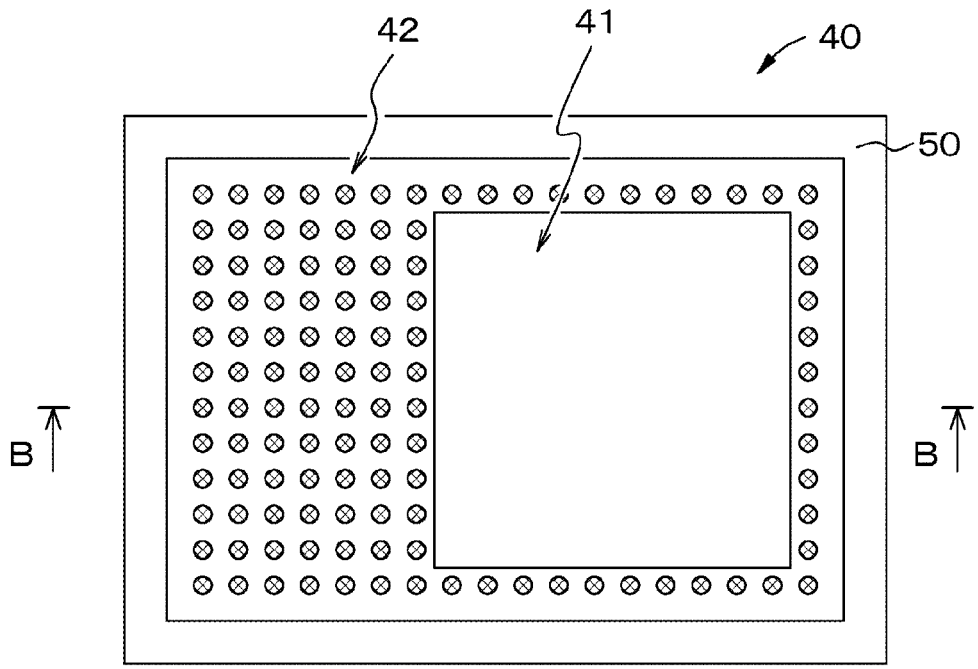
FIG. 5A is a schematic plan view of an electrode pad section in the imaging element according to the first embodiment.
Figure 5B:
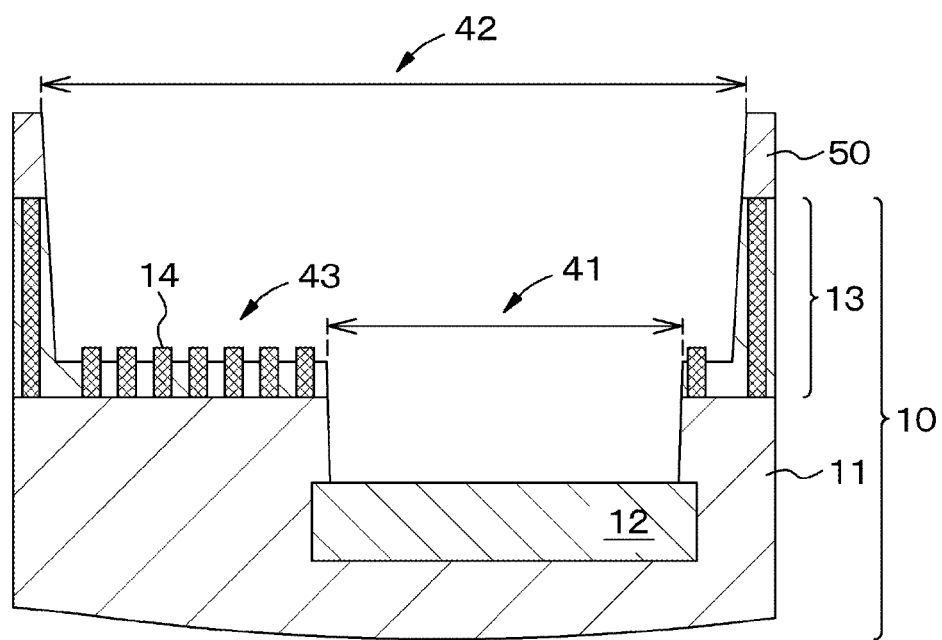
FIG. 5B is a schematic sectional view of a region taken along a line B-B in FIG. 5A.

FIG. 5A is a schematic plan view of an electrode pad section in the imaging element according to the first embodiment. FIG. 5B is a schematic sectional view of a region taken along a line B-B in FIG. 5A.

In the imaging element 1, the surface of the terrace 43 in the bonding pad section 40 is formed such that multiple types of materials having different refractive indexes are exposed. More specifically, the surface of the terrace 43 in the bonding pad section 40 is formed such that at least one of the multiple types of materials is exposed in a spaced dot pattern.

As mentioned above, the substrate includes a semiconductor material layer. A portion including the semiconductor material layer and a portion including a material different from the material constituting the semiconductor material layer are formed to be exposed on the surface of the terrace 43 in the bonding pad section 40. More specifically, the semiconductor material layer includes a silicon layer, and a portion including the silicon layer and a portion including a material different from silicon are formed to be exposed on the surface of the terrace 43 in the bonding pad section 40.

In the imaging element 1, a material different from silicon, for example, silicon oxide ($SiO_x$) is embedded in a portion of the silicon layer corresponding to the second opening 42. In the example shown in the figure, a silicon oxide 14 is embedded so as to be exposed on the surface of the terrace 43 in the bonding pad section 40 in a spaced dot pattern. Accordingly, a portion including silicon (refractive index: about 3.5) and a portion including silicon oxide (refractive index: about 1.4) are exposed on the surface of the terrace 43. The refractive indexes of the constituent materials can be determined by measurement using, for example, an ellipsometer.

Further, in the example shown in the figure, a portion where the multiple types of materials are exposed is formed to have different heights for each material on the surface of the terrace 43 in the bonding pad section 40. More specifically, a portion of the silicon oxide 14 having a relatively low refractive index is formed so as to protrude further than silicon.

FIG. 6 is a schematic partial sectional view for describing reflection of light in the imaging element mounted on a package substrate according to the first embodiment.

External light passes through the seal glass and enters the imaging element 1. At this time, when external light enters the pad opening, the light is reflected on the surface of the terrace 43. However, since the surface of the terrace 43 in the bonding pad section 40 is formed such that multiple types of materials are exposed, the total reflection condition differs depending on locations, and therefore, the light reflection direction differs depending on locations. Further, since the surface of the terrace 43 has an uneven structure, light is reflected while being further scattered. Thus, the degree of the influence of the reflected light on the photoelectric conversion unit 20 is reduced, and as a result, the flare is reduced.

Note that, although the silicon portion and the silicon oxide portion are exposed on the surface of the terrace 43 in the example described above, a silicon portion and a silicon nitride ($SiN_x$, refractive index: about 2.0) portion may be exposed. Further, a silicon portion, a silicon oxide portion, and a silicon nitride portion may be exposed.

Figure 7A:
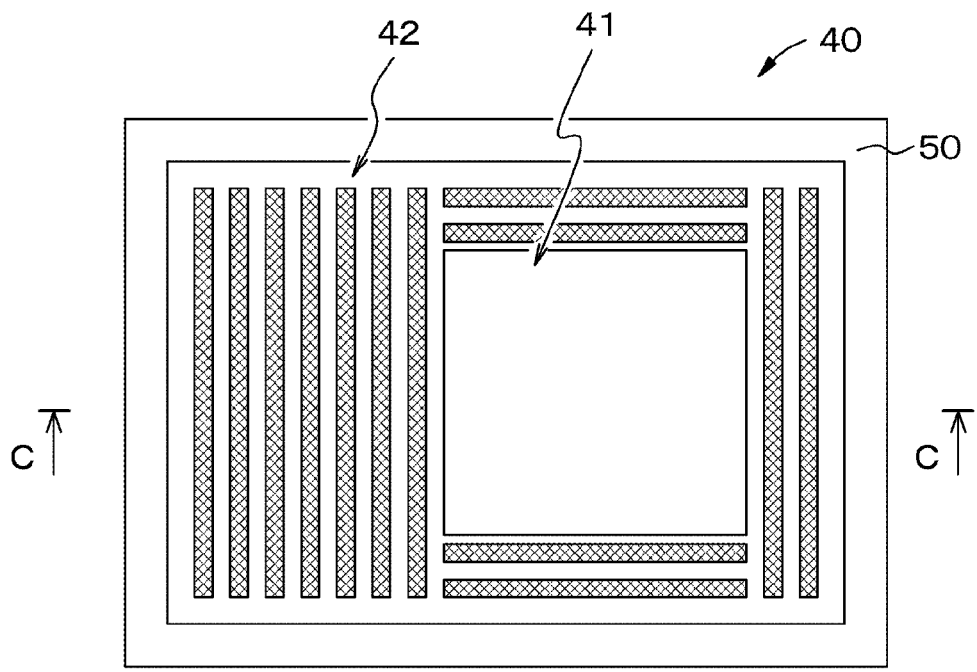
FIG. 7A is a schematic plan view of an electrode pad section in an imaging element according to a first modification.
Figure 7B:
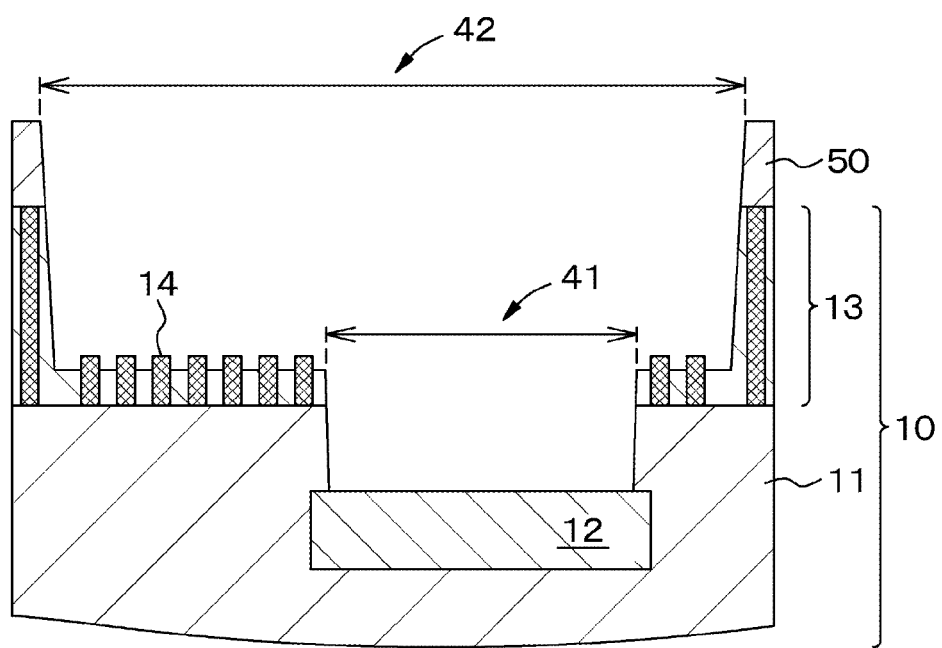
FIG. 7B is a schematic sectional view of a region taken along a line C-C in FIG. 7A.

In the example shown in FIG. 5, the silicon oxide is exposed in a spaced dot pattern. However, at least one of the multiple types of materials may be exposed in, for example, a spaced line pattern (first modification) on the surface of the terrace 43 in the bonding pad section 40. FIG. 7A is a schematic plan view of an electrode pad section in an imaging element according to a first modification. FIG. 7B is a schematic sectional view of a region taken along a line C-C in FIG. 7A.

Figure 8A:
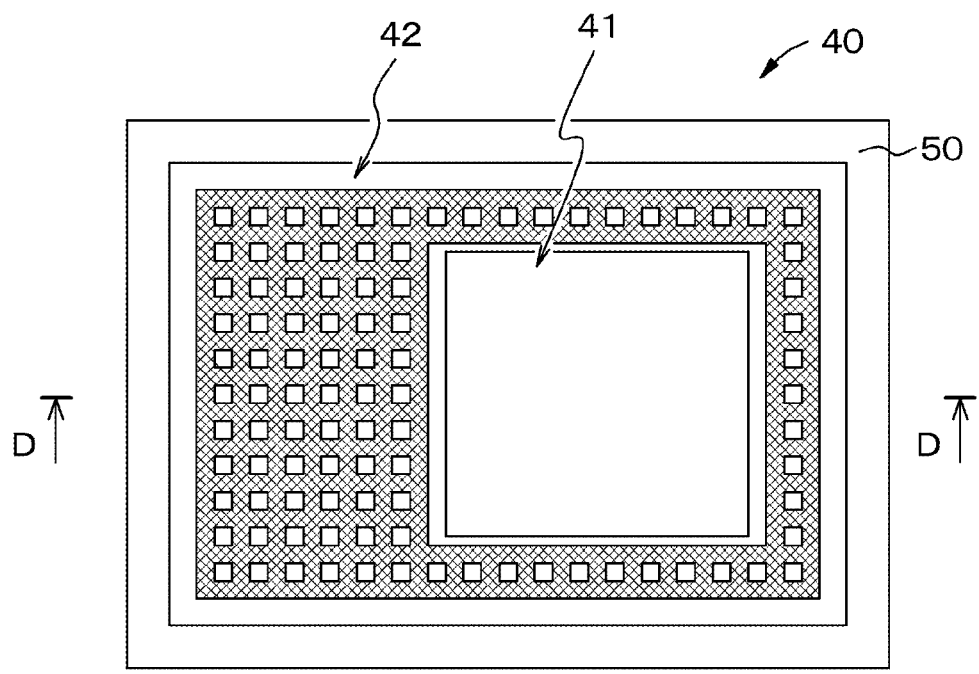
FIG. 8A is a schematic plan view of an electrode pad section in an imaging element according to a second modification.
Figure 8B:
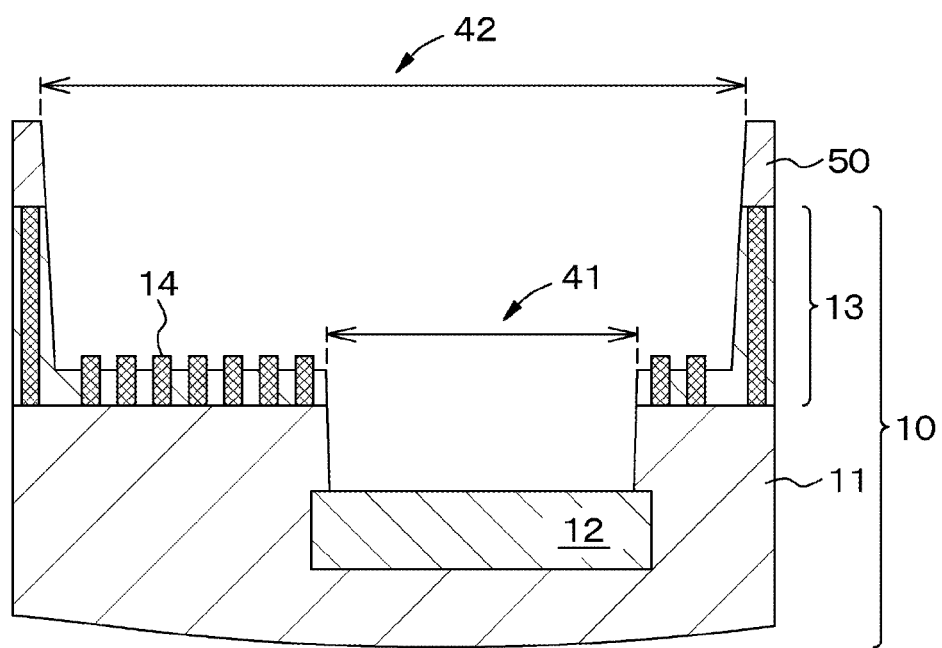
FIG. 8B is a schematic sectional view of a region taken along a line D-D in FIG. 8A.

Alternatively, at least one of the multiple types of materials may be exposed in a matrix pattern (second modification) on the surface of the terrace 43 in the bonding pad section 40. FIG. 8A is a schematic plan view of an electrode pad section in an imaging element according to a second modification. FIG. 8B is a schematic sectional view of a region taken along a line D-D in FIG. 8A.

Second Embodiment

The second embodiment relates to a method for manufacturing an imaging element. Here, a method for manufacturing an imaging element will be described by taking a back-illuminated imaging element having a laminated structure as an example.

As described in the first embodiment, the imaging element 1 includes the photoelectric conversion unit 20 that outputs an image signal according to received light and the bonding pad section 40, the photoelectric conversion unit 20 and the bonding pad section 40 being disposed on one surface side of the substrate, the bonding pad section 40 having at least the first opening 41 provided to expose the pad electrode 12 at a bottom, and the second opening 42 that is arranged to surround the first opening 41 and that is shallower than the first opening 41.

The method for manufacturing the imaging element 1 according to the second embodiment includes:

a step of placing the photoelectric conversion unit 20 to be provided in a semiconductor material layer on the substrate;

a step of forming a trench in a portion of the semiconductor material layer corresponding to the second opening 42;

a step of embedding a material different from a material constituting the semiconductor material layer in the trench in the semiconductor material layer;

a step of forming the first opening 41; and a step of forming the second opening 42.

The method for manufacturing the imaging element 1 according to the second embodiment further includes:

a step of thinning a surface of the semiconductor material layer on a side of a photodiode that constitutes the photoelectric conversion unit 20 after the photoelectric conversion unit 20 is formed in the semiconductor material layer. Further, the step of forming a trench in a portion of the semiconductor material layer corresponding to the second opening 42 and the step of embedding a material different from a material constituting the semiconductor material layer in the trench of the semiconductor material layer are performed after the step of thinning the surface of the semiconductor material layer.

Figure 9A:
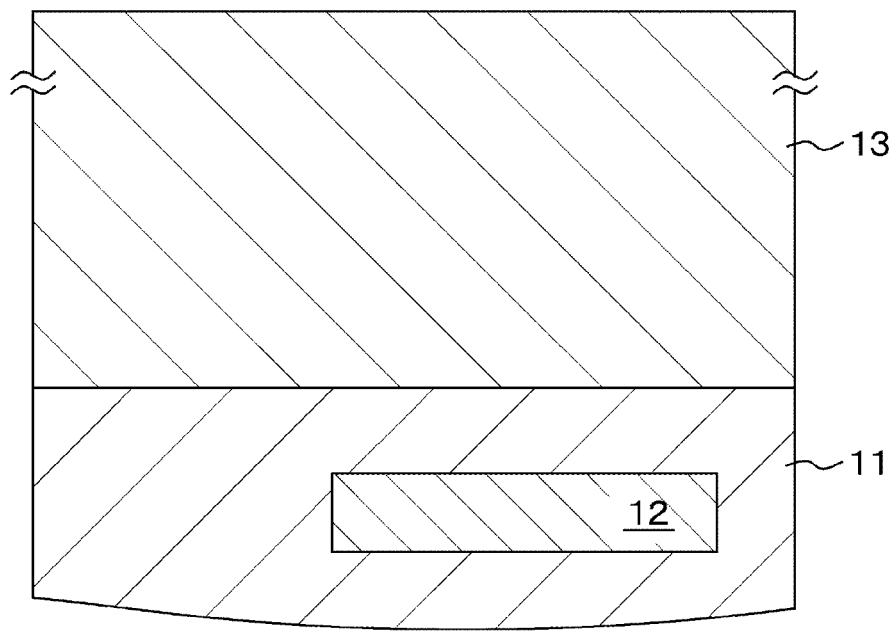
FIGS. 9A and 9B are schematic sectional views for describing a method for manufacturing an imaging element according to a second embodiment.
Figure 9B:
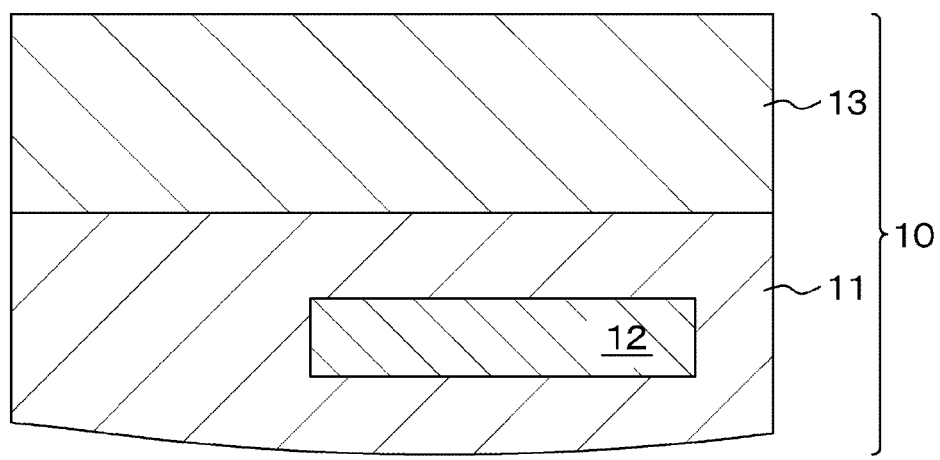
Figure 10A:
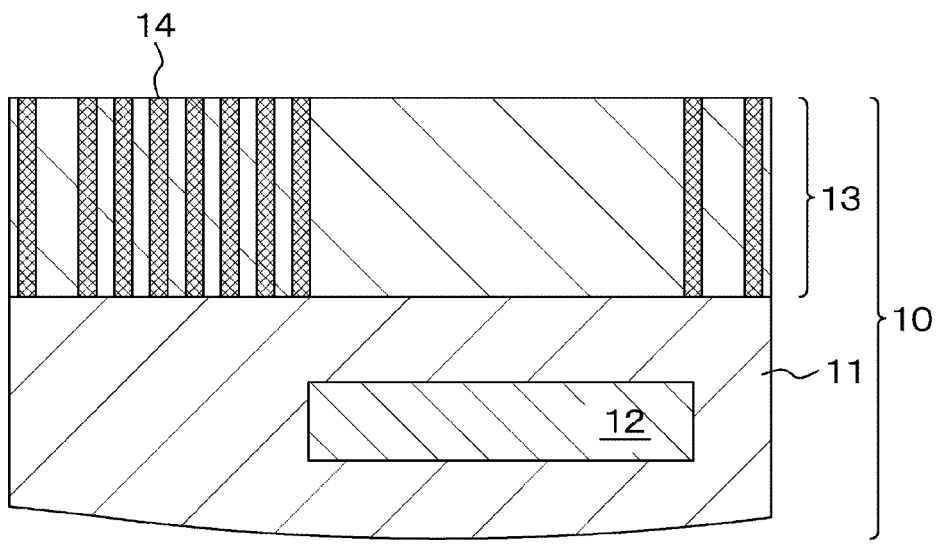
FIGS. 10A and 10B are schematic sectional views showing steps after FIG. 9B for describing the method for manufacturing an imaging element.
Figure 10B:
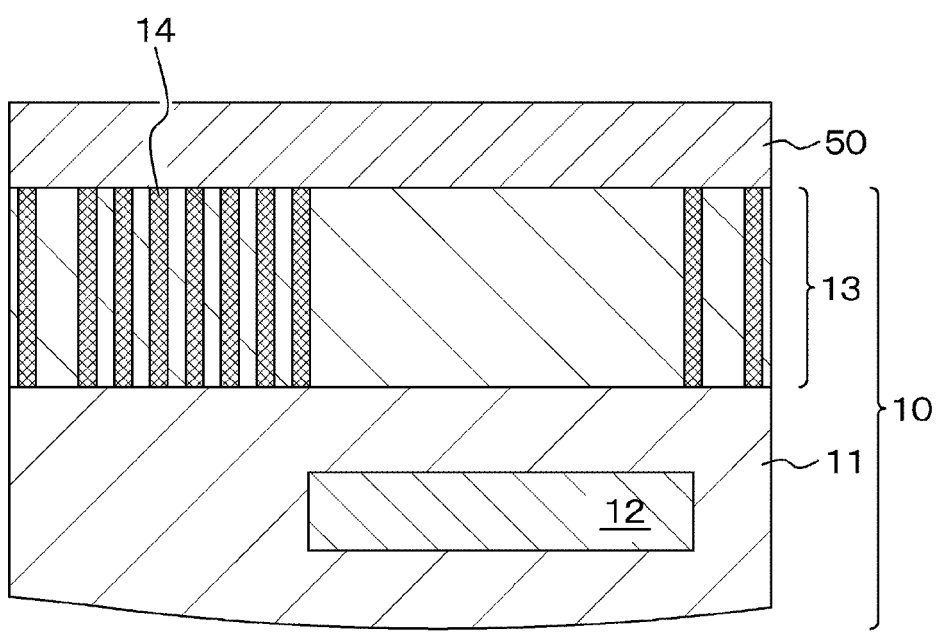
Figure 11A:
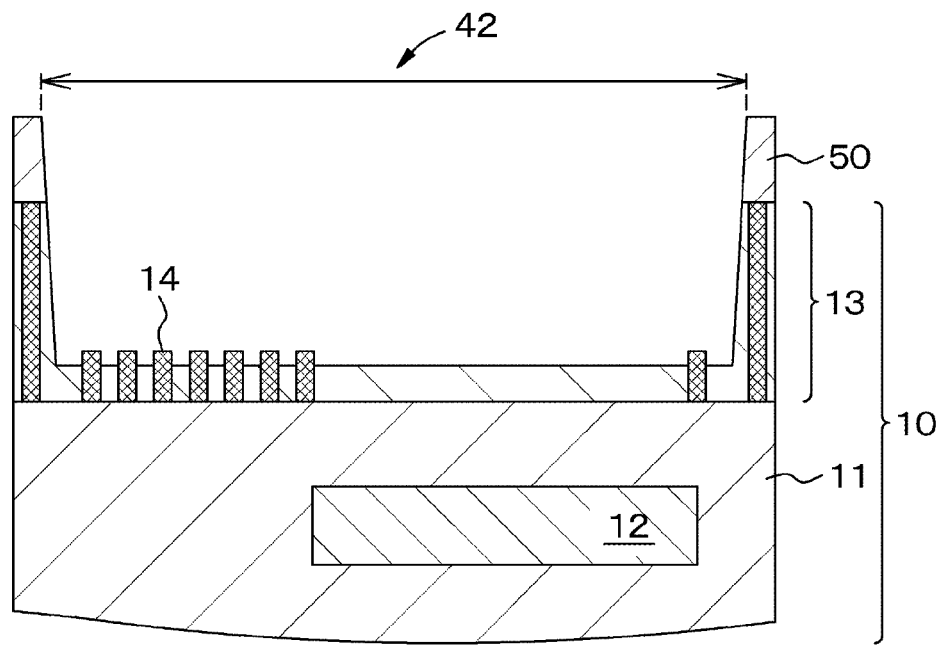
FIGS. 11A and 11B are schematic sectional views showing steps after FIG. 10B for describing the method for manufacturing an imaging element.
Figure 11B:
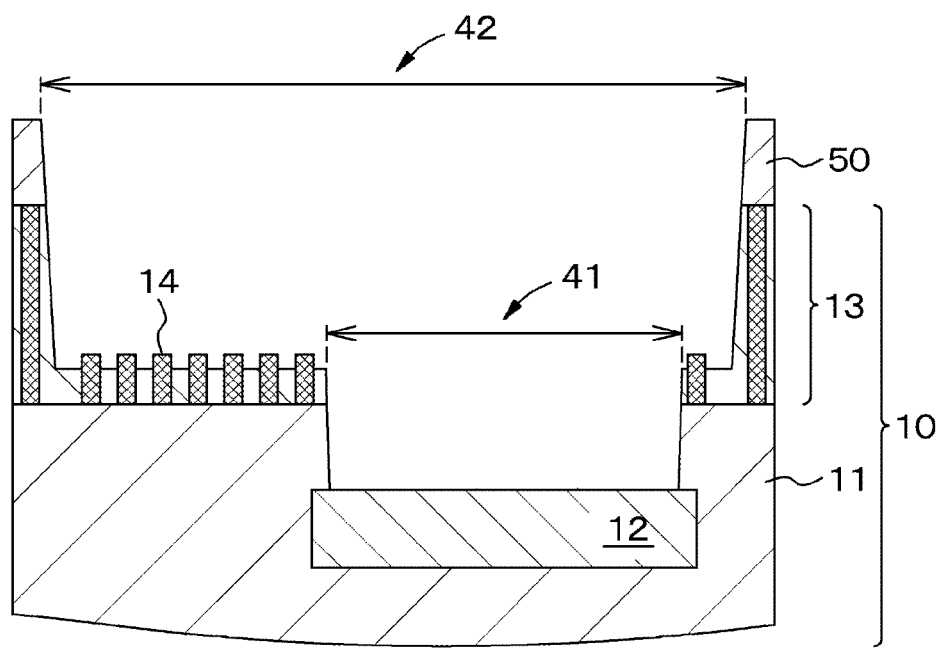

FIGS. 9A and 9B are schematic sectional views for describing the method for manufacturing an imaging element according to the second embodiment. FIGS. 10A and 10B are schematic sectional views showing steps after FIG. 9B for describing the method for manufacturing an imaging element. FIGS. 11A and 11B are schematic sectional views showing steps after FIG. 10B for describing the method for manufacturing an imaging element. Note that these drawings correspond to FIG. 5 and the like, and show the structure of a portion corresponding to the bonding pad section 40 of the imaging element. Therefore, components such as the photoelectric conversion unit 20 are not illustrated.

Hereinafter, a method for manufacturing the imaging element 1 will be described with reference to the drawings.

First, a semiconductor material layer 13 in the form of a wafer in which pixels including photoelectric conversion elements such as photodiodes are formed, and a laminate including an insulating layer 11 in which a pad electrode 12 is embedded are prepared, and they are laminated (see FIG. 9A). For convenience of description, the semiconductor material layer 13 may be referred to as a wafer 13 in some cases. The similar applies to a third embodiment described later.

Next, the wafer 13 is thinned on the photodiode side (see FIG. 9B). The thinning can be performed by a known method such as grinding, polishing, or etching. For example, the thinning can be performed by the method disclosed in Japanese Patent Application Laid-Open No. 2011-96851.

Thereafter, a trench is formed in a portion of a region of the wafer 13 corresponding to the second opening 42, and then a material 14 (for example, silicon oxide) different from the material constituting the wafer 13 is laminated and embedded in the trench. The embedding can be performed by a known method such as a CVD (chemical vapor deposition) method, a sputtering method, or an ALD (atomic layer deposition) method. FIG. 10A shows a state after the silicon oxide in regions other than the inside of the trench is removed.

Next, constituent elements unique to the imaging element, such as a material constituting the guard ring, a color filter, and an on-chip lens, are provided. For convenience of illustration, FIG. 10B shows only the material layer 50 constituting the guard ring.

Thereafter, the material in the region corresponding to the second opening 42 is removed so that a part of the semiconductor material layer 13 is left. This can be performed using, for example, a lithography method and a dry etching method. As a result, a portion of the semiconductor material and a portion of a material different in type from the semiconductor material are exposed on the terrace 43 of the second opening 42 (see FIG. 11A). In a case where the etching rate differs for each material, a difference is generated in height, and the surface of the terrace 43 becomes uneven.

Next, the material in the region corresponding to the first opening 41 is removed so that the pad electrode 12 is exposed. This can be performed using, for example, a lithography method and a dry etching method.

Through the above steps, the imaging element 1 described in the first embodiment can be manufactured.

Third Embodiment

The third embodiment also relates to a method for manufacturing an imaging element. Here, a method for manufacturing an imaging element will be described by taking a back-illuminated imaging element having a laminated structure as an example.

The third embodiment is different from the second embodiment mainly in that a step of forming a trench in a portion of the semiconductor material layer corresponding to the second opening and a step of embedding a material different from the material constituting the semiconductor material layer in the trench of the semiconductor material layer are performed before the step of thinning the surface of the semiconductor material layer.

Figure 12A:
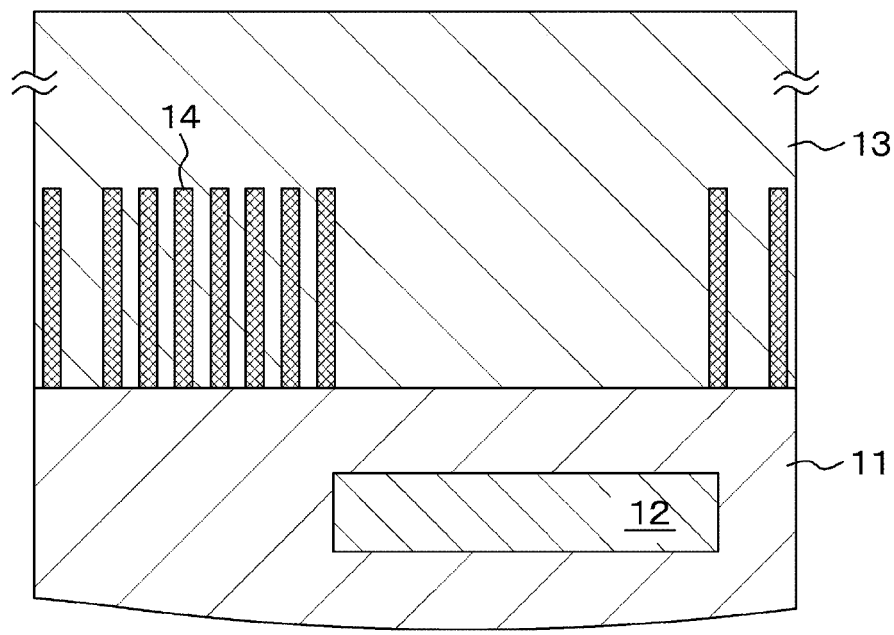
FIGS. 12A and 12B are schematic sectional views for describing a method for manufacturing an imaging element according to a third embodiment.
Figure 12B:
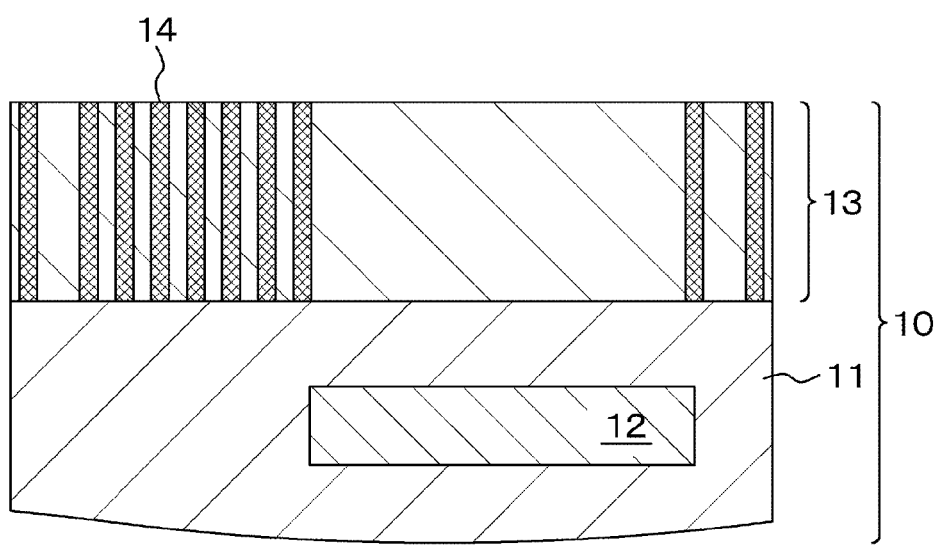

FIGS. 12A and 12B are schematic sectional views for describing the method for manufacturing an imaging element according to the third embodiment. Note that these drawings correspond to FIG. 5 and the like, and show the structure of a portion corresponding to the bonding pad section 40 of the imaging element. Therefore, components such as the photoelectric conversion unit 20 are not illustrated.

Hereinafter, a method for manufacturing the imaging element 1 will be described with reference to the drawings.

First, a semiconductor material layer 13 in the form of a wafer on which pixels including photoelectric conversion elements such as photodiodes are formed is prepared. In the third embodiment, before lamination, a trench is formed in a portion of a region of the wafer 13 corresponding to the second opening 42, and then a material 14 (for example, silicon oxide) different from the material constituting the wafer 13 is laminated and embedded in the trench. These steps can be performed in a similar manner as in the second embodiment.

Next, the wafer 13 and a laminate including the insulating layer 11 in which the pad electrode 12 is embedded are laminated (see FIG. 12A).

Thereafter, the wafer 13 is thinned on the photodiode side (see FIG. 12B). The thinning can be performed in a similar manner as in the second embodiment.

Note that, although FIG. 12B shows that the material 14 is exposed, the thinning may be completed in a state where the material 14 is not exposed.

Next, steps similar to those described with reference to FIGS. 10B, 11A, and 11B in the second embodiment are performed.

Through the above steps, the imaging element 1 described in the first embodiment can be manufactured.

Subsequently, commonality of processes will be described. Generally, in a series of processes for manufacturing an imaging element, formation of a trench, embedding of a material in the trench, and smoothing are commonly performed. Therefore, it is also possible to perform the process for the second opening in a common step with a process for other sections, although this depends on the process configuration. This will be described below with reference to FIG. 13.

Figure 13:
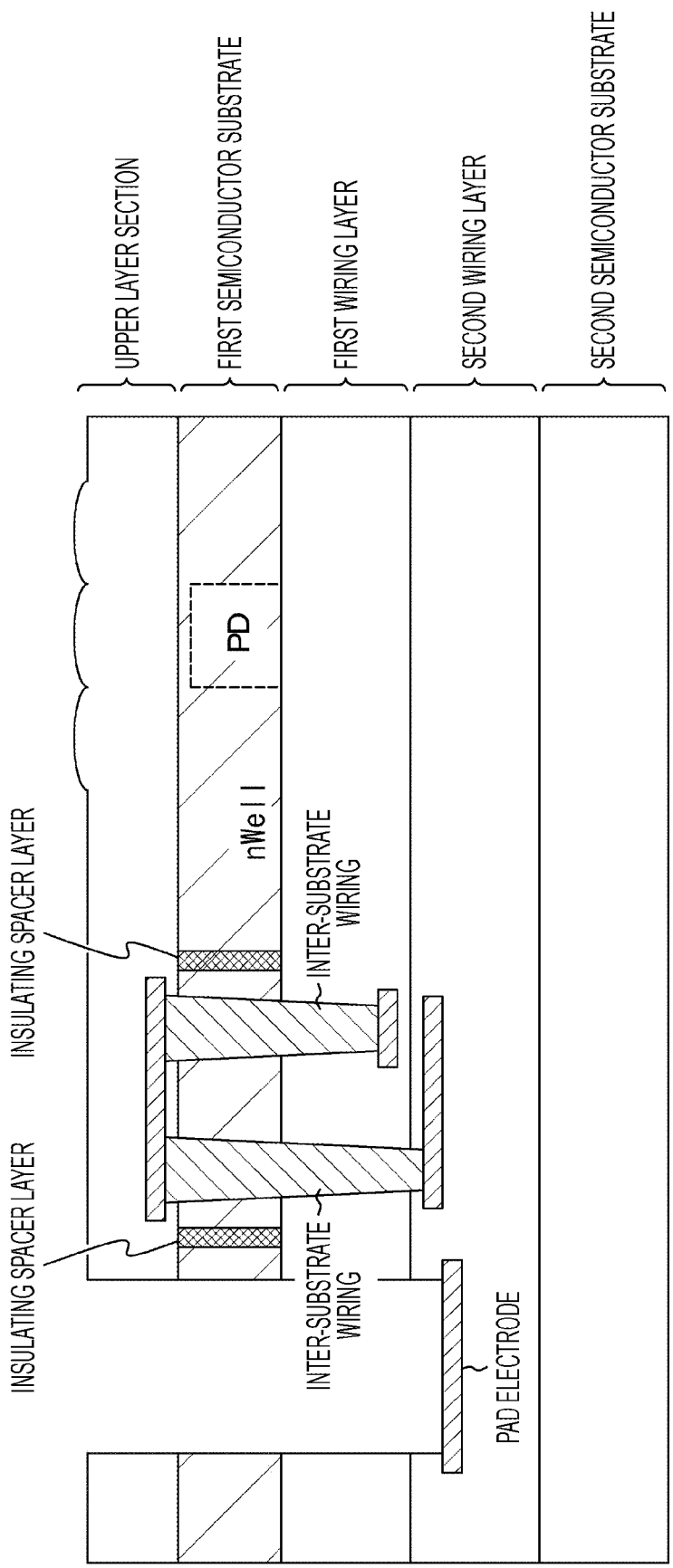
FIG. 13 is a schematic sectional view for describing the structure of an imaging element disclosed in Japanese Patent Application Laid-Open No. 2011-96851.

FIG. 13 is a schematic sectional view for describing the structure of the imaging element disclosed in Japanese Patent Application Laid-Open No. 2011-96851. More specifically, FIG. 13 corresponds to FIG. 3 of Japanese Patent Application Laid-Open No. 2011-96851. Note that the structure is simplified for convenience of illustration.

The imaging element shown in FIG. 13 is a back-illuminated imaging element, and has a configuration in which an upper layer section, a first semiconductor substrate, a first wiring layer, a second wiring layer, and a second semiconductor substrate are laminated. After a photodiode (indicated by a symbol PD in the figure) and a transistor (not shown) are formed, the first semiconductor substrate is thinned by a process such as polishing on the light receiving surface side of the PD. In order to establish electrical connection between layers, an inter-substrate wiring is formed, for example, so as to penetrate the first semiconductor substrate. Then, an insulating spacer layer is provided so as to surround the inter-substrate wiring in order to isolate a predetermined region in the well of the first semiconductor substrate.

This insulating spacer layer is formed on the first semiconductor substrate by processes including a step of forming a trench, a step of embedding a material in the trench, and a smoothing step. Therefore, in the third embodiment, a step of forming a trench in a portion of the semiconductor material layer corresponding to the second opening and a step of embedding a material different from the material constituting the semiconductor material layer in the trench of the semiconductor material layer can be performed in a common step with the step of forming the insulating spacer layer shown in FIG. 13.

Application Example

The technology according to the present disclosure can be applied to various products. For example, the technology according to the present disclosure may be implemented as a device to be mounted on any type of mobile bodies such as vehicles, electric vehicles, hybrid electric vehicles, motorcycles, bicycles, personal mobilities, airplanes, drones, ships, robots, construction machines, and agricultural machines (tractors).

Figure 14:
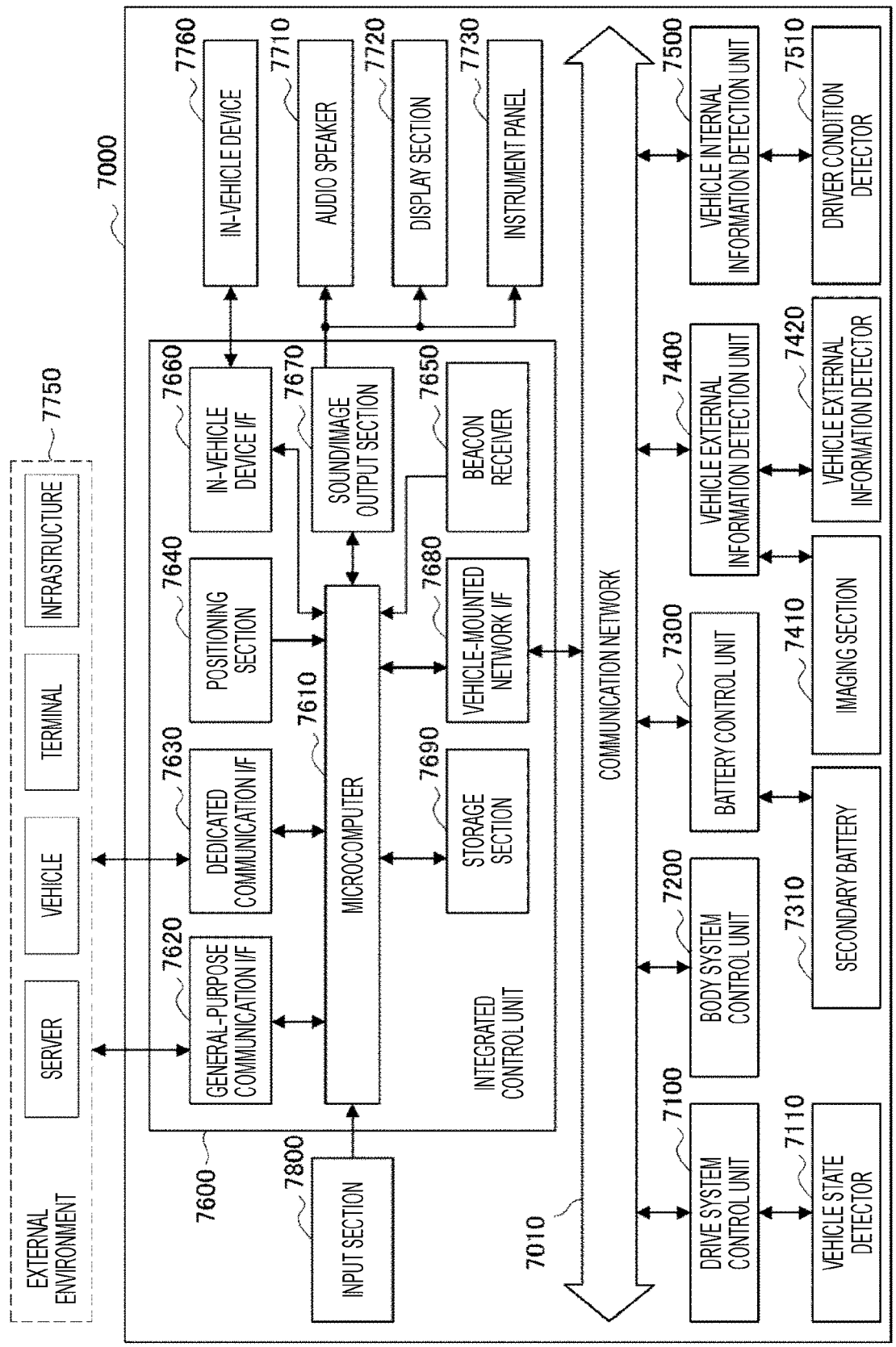
FIG. 14 is a block diagram showing an example of a schematic configuration of a vehicle control system.

FIG. 14 is a block diagram showing a schematic configuration example of a vehicle control system 7000 which is an example of a mobile body control system to which the technology according to the present disclosure can be applied. The vehicle control system 7000 includes a plurality of electronic control units connected to each other via a communication network 7010. In the example shown in FIG. 14, the vehicle control system 7000 includes a drive system control unit 7100, a body system control unit 7200, a battery control unit 7300, a vehicle external information detection unit 7400, a vehicle internal information detection unit 7500, and an integrated control unit 7600. The communication network 7010 connecting the plurality of control units may be, for example, an in-vehicle communication network compliant with any of standards such as controller area network (CAN), local interconnect network (LIN), local area network (LAN), and FlexRay (registered trademark).

Each control unit includes a microcomputer that performs arithmetic processing according to various programs, a storage section that stores programs executed by the microcomputer, parameters used for various calculations, or the like, and a driving circuit that drives various devices to be controlled. Each control unit is equipped with a network I/F for communicating with other control units via the communication network 7010, and a communication I/F for communicating with devices, sensors, or the like inside and outside the vehicle by way of wired communication or wireless communication. FIG. 14 illustrates, as the functional configuration of the integrated control unit 7600, a microcomputer 7610, a general-purpose communication I/F 7620, a dedicated communication I/F 7630, a positioning section 7640, a beacon receiver 7650, an in-vehicle device I/F 7660, a sound/image output section 7670, an in-vehicle network I/F 7680, and a storage section 7690. Similarly, the other control units include microcomputers, communication I/Fs, storage sections, and the like.

The drive system control unit 7100 controls the operation of devices related to a drive system of a vehicle according to various programs. For example, the drive system control unit 7100 functions as a control device over a driving force generating device such as an internal combustion engine or a driving motor for generating a driving force of the vehicle, a driving force transmission mechanism for transmitting the driving force to wheels, a steering mechanism adjusting a steering angle of the vehicle, a braking device that generates a braking force of the vehicle, and the like. The drive system control unit 7100 may have a function as a control device such as an antilock brake system (ABS) or electronic stability control (ESC).

The drive system control unit 7100 is connected with a vehicle state detector 7110. The vehicle state detector 7110 includes, for example, at least one of a gyro sensor that detects the angular velocity of axial rotational movement of a vehicle body, an acceleration sensor that detects the acceleration of the vehicle, or sensors for detecting an amount of operation of an accelerator pedal, an amount of operation of a brake pedal, the steering angle of a steering wheel, an engine speed or the rotational speed of wheels, and the like. The drive system control unit 7100 performs arithmetic processing using a signal input from the vehicle state detector 7110, and controls the internal combustion engine, the driving motor, an electric power steering device, the brake device, and the like.

The body system control unit 7200 controls operations of various devices mounted on the vehicle body according to various programs. For example, the body system control unit 7200 functions as a keyless entry system, a smart key system, a power window device, or a control device for various lamps such as a headlamp, a backup lamp, a brake lamp, a blinker, or a fog lamp. In this case, the body system control unit 7200 can receive radio waves transmitted from a portable device that can be used as a key or signals from various switches. The body system control unit 7200 receives input of these radio waves or signals, and controls a door lock device, power window device, lamps, and the like of the vehicle.

The battery control unit 7300 controls a secondary battery 7310 that is a power supply source for the driving motor according to various programs. For example, the battery control unit 7300 is supplied with information about a battery temperature, a battery output voltage, an amount of charge remaining in the battery, or the like from a battery device including the secondary battery 7310. The battery control unit 7300 performs arithmetic processing using these signals, and performs control for regulating the temperature of the secondary battery 7310 or controls a cooling device or the like provided to the battery device.

The vehicle external information detection unit 7400 detects information regarding the outside of the vehicle equipped with the vehicle control system 7000.

For example, the vehicle external information detection unit 7400 is connected with at least one of an imaging section 7410 or a vehicle external information detector 7420. The imaging section 7410 includes at least one of a time of flight (ToF) camera, a stereo camera, a monocular camera, an infrared camera, or other cameras. The vehicle external information detector 7420 includes, for example, at least one of an environmental sensor for detecting current atmospheric conditions or weather conditions or a peripheral information detecting sensor for detecting another vehicle, an obstacle, a pedestrian, or the like around the vehicle equipped with the vehicle control system 7000.

The environmental sensor may be, for example, at least one of a raindrop sensor that detects rainy weather, a fog sensor that detects fog, a sunlight sensor that detects sunlight intensity, or a snow sensor that detects snowfall. The peripheral information detecting sensor may be at least one of an ultrasonic sensor, a radar device, or a light detection and ranging, laser imaging detection and ranging (LIDAR) device. Each of the imaging section 7410 and the vehicle external information detector 7420 may be provided as an independent sensor or device, or may be provided as a device in which a plurality of sensors or devices is integrated.

Figure 15:
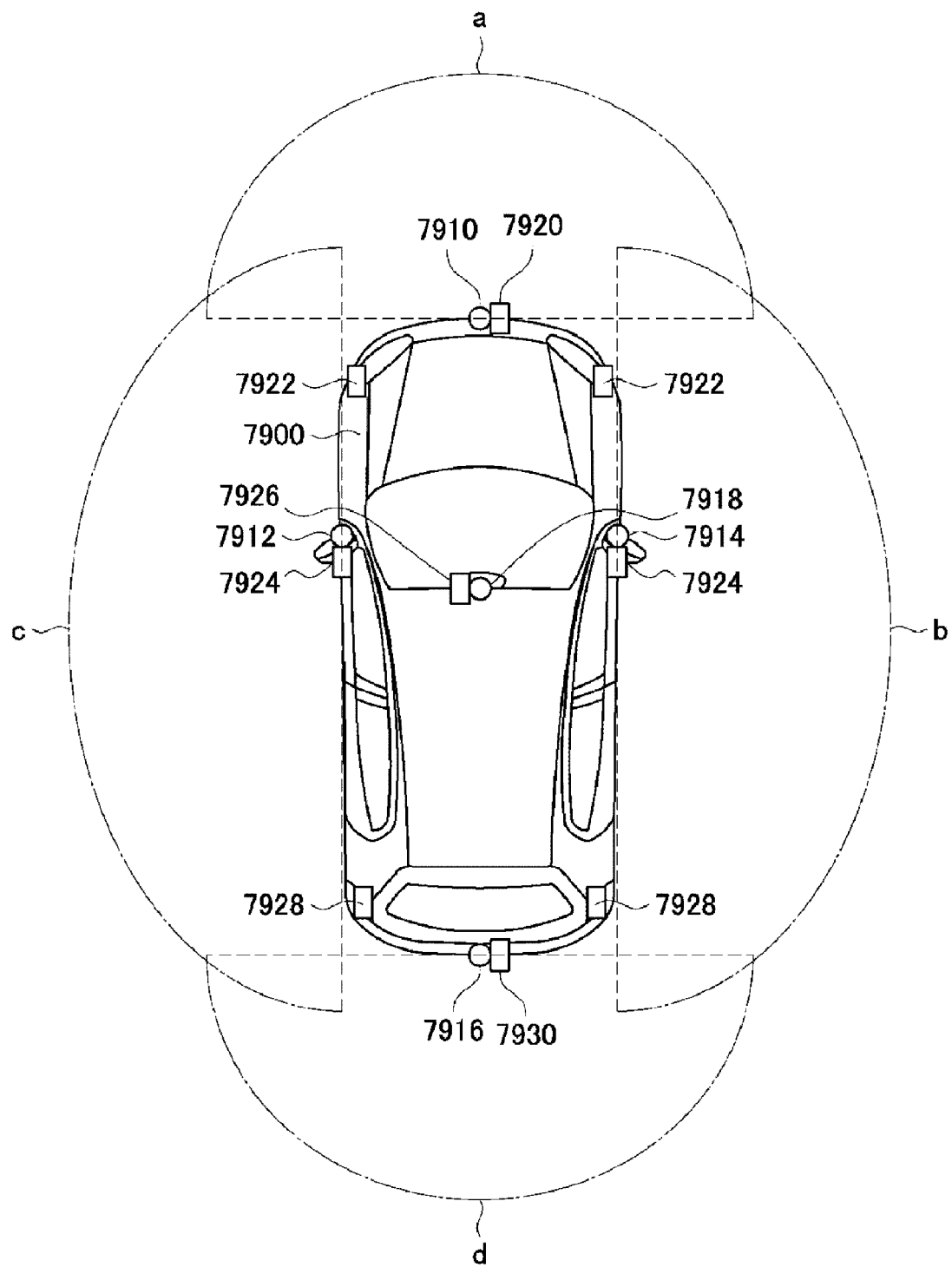
FIG. 15 is an explanatory view showing an example of installation positions of vehicle external information detectors and imaging sections.

Here, FIG. 15 shows an example of installation positions of the imaging section 7410 and the vehicle external information detector 7420. Imaging sections 7910, 7912, 7914, 7916, and 7913 are provided at, for example, at least one of a front nose, sideview mirrors, a rear bumper, and a back door of the vehicle 7900 or an upper part of the windshield in the interior of the vehicle. The imaging section 7910 provided on the front nose and the imaging section 7918 provided at the upper part of the windshield in the interior of the vehicle mainly acquire an image of an environment in front of the vehicle 7900. The imaging sections 7912 and 7914 provided on the sideview mirrors mainly acquire an image of an environment on the side of the vehicle 7900. The imaging section 7916 provided on the rear bumper or the back door mainly acquires an image of an environment behind the vehicle 7900. The imaging section 7918 provided at the upper part of the windshield in the interior of the vehicle is mainly used for detecting a preceding vehicle, a pedestrian, an obstacle, a traffic light, a traffic sign, a lane, or the like.

Note that FIG. 15 shows an example of an imaging range of the respective imaging sections 7910, 7912, 7914, and 7916. An imaging range a indicates the imaging range of the imaging section 7910 provided on the front nose, imaging ranges b and c indicate the imaging ranges of the imaging sections 7912 and 7914 provided on the sideview mirrors, respectively, and an imaging range d indicates the imaging range of the imaging section 7916 provided on the rear bumper or the back door. A bird's-eye image of the vehicle 7900 as viewed from above can be obtained by superimposing image data captured by the imaging sections 7910, 7912, 7914, and 7916, for example.

Vehicle external information detectors 7920, 7922, 7924, 7926, 7928, and 7930 provided to the front, rear, sides, and corners of the vehicle 7900 and upper part of the windshield in the interior of the vehicle may be an ultrasonic sensor or a radar device, for example. The vehicle external information detectors 7920, 7926, and 7930 provided to the front nose, the rear bumper, and the back door of the vehicle 7900 and at the upper part of the windshield in the interior of the vehicle may be, for example, a LIDAR device. These vehicle external information detectors 7920 to 7930 are mainly used for detecting a preceding vehicle, a pedestrian, an obstacle, or the like.

Returning back to FIG. 14, the description will be continued. The vehicle external information detection unit 7400 causes the imaging section 7410 to capture an image outside the vehicle, and receives the captured image data. Further, the vehicle external information detection unit 7400 receives detection information from the vehicle external information detector 7420 connected thereto. In a case where the vehicle external information detector 7420 is an ultrasonic sensor, a radar device, or a LIDAR device, the vehicle external information detection unit 7400 transmits ultrasonic waves, electromagnetic waves, or the like, and receives information of the received reflected waves. The vehicle external information detection unit 7400 may perform, on the basis of the received information, a processing of detecting an object such as a person, a vehicle, an obstacle, a road sign, or a character on a road surface, or a processing of detecting the distance thereto. The vehicle external information detection unit 7400 may perform an environment recognition processing for recognizing rainfall, fog, road surface conditions, or the like on the basis of the received information. The vehicle external information detection unit 7400 may calculate a distance to an object outside the vehicle on the basis of the received information.

Furthermore, on the basis of the received image data, the vehicle external information detection unit 7400 may perform image recognition processing of recognizing a person, a vehicle, an obstacle, a road sign, a character on a road surface, or the like, or processing of detecting a distance thereto. The vehicle external information detection unit 7400 may perform a processing such as distortion correction or alignment on the received image data, and combine the image data captured by different imaging sections 7410 to generate a bird's-eye image or a panoramic image. The vehicle external information detection unit 7400 may perform a viewpoint conversion processing using the image data captured by different imaging sections 7410.

The vehicle internal information detection unit 7500 detects information regarding the inside of the vehicle. For example, the vehicle internal information detection unit 7500 is connected with a driver condition detector 7510 that detects a condition of a driver. The driver condition detector 7510 may include a camera that captures an image of the driver, a biosensor that detects biological information of the driver, a microphone that collects sound within the interior of the vehicle, or the like. The biosensor is disposed in, for example, a seat surface, the steering wheel, or the like, and detects biological information of an occupant seated in a seat or the driver holding the steering wheel. On the basis of detection information input from the driver condition detector 7510, the vehicle internal information detection unit 7500 may calculate a degree of fatigue of the driver or a degree of concentration of the driver, or may determine whether or not the driver is dozing. The vehicle internal information detection unit 7500 may perform a processing such as a noise canceling processing on an audio signal of collected sound.

The integrated control unit 7600 controls general operation within the vehicle control system 7000 in accordance with various kinds of programs. The integrated control unit 7600 is connected with an input section 7800. The input section 7800 is implemented by, for example, a device capable of input operation by an occupant, such as a touch panel, a button, a microphone, a switch, or a lever. The integrated control unit 7600 may be supplied with data obtained by voice recognition of voice input through the microphone. The input section 7800 may be, for example, a remote control device using infrared rays or other radio waves, or an external connecting device corresponding to the operation of the vehicle control system 7000, such as a mobile telephone or a personal digital assistant (PDA). The input section 7800 may be, for example, a camera. In that case, an occupant can input information by gesture. Alternatively, data may be input which is obtained by detecting the movement of a wearable device worn by an occupant. Moreover, the input section 7800 may include, for example, an input control circuit or the like that generates an input signal on the basis of information input by an occupant or the like using the above-described input section 7800, and which outputs the generated input signal to the integrated control unit 7600. An occupant or the like inputs various kinds of data or gives an instruction for processing operation to the vehicle control system 7000 by operating the input section 7800.

The storage section 7690 may include a read only memory (ROM) that stores various kinds of programs executed by the microcomputer and a random access memory (RAM) that stores various kinds of parameters, operation results, sensor values, or the like. In addition, the storage section 7690 may be implemented by a magnetic storage device such as a hard disc drive (HDD), a semiconductor storage device, an optical storage device, a magneto-optical storage device, or the like.

The general-purpose communication I/F 7620 is a generic communication I/F that mediates communication with various apparatuses present in an external environment 7750. The general-purpose communication I/F 7620 may implement a cellular communication protocol such as global system of mobile communications (GSM) (registered trademark), worldwide interoperability for microwave access (WiMAX) (registered trademark), long term evolution (LTE) (registered trademark), or LTE-advanced (LTE-A), or another wireless communication protocol such as wireless LAN (referred to also as wireless fidelity (Wi-Fi) (registered trademark)) or Bluetooth (registered trademark). The general-purpose communication I/F 7620 may, for example, connect to an apparatus (for example, an application server or a control server) present on an external network (for example, the Internet, a cloud network, or a company-specific network) via a base station or an access point. In addition, the general-purpose communication I/F 7620 may connect to a terminal (for example, a terminal of the driver, a pedestrian, or a store, or a machine type communication (MTC) terminal) present in the vicinity of the vehicle using a peer to peer (P2P) technology, for example.

The dedicated communication I/F 7630 is a communication I/F that supports a communication protocol developed for use in vehicles. The dedicated communication I/F 7630 may implement, for example, a standard protocol, such as wireless access in vehicle environment (WAVE), which is a combination of institute of electrical and electronic engineers (IEEE) 802.11p as a lower layer and IEEE 1609 as a higher layer, dedicated short range communications (DSRC), or a cellular communication protocol. The dedicated communication I/F 7630 typically carries out V2X communication as a concept including one or more of vehicle to vehicle communication, vehicle to infrastructure communication, vehicle to home communication, and vehicle to pedestrian communication.

The positioning section 7640, for example, performs positioning by receiving a global navigation satellite system (GNSS) signal from a GNSS satellite (for example, a global positioning system (GPS) signal from a GPS satellite), and generates positional information including the latitude, longitude, and altitude of the vehicle. Note that the positioning section 7640 may identify a current position by exchanging signals with a wireless access point, or may obtain the positional information from a terminal such as a mobile telephone, a personal handyphone system (PHS), or a smart phone that has a positioning function.

The beacon receiver 7650, for example, receives radio waves or electromagnetic waves transmitted from a radio station installed on a road or the like, and thereby obtains information about the current position, congestion, a closed road, a necessary time, or the like. Note that the function of the beacon receiver 7650 may be included in the dedicated communication I/F 7630 described above.

The in-vehicle device I/F 7660 is a communication interface that mediates connection between the microcomputer 7610 and various in-vehicle devices 7760 present within the vehicle. The in-vehicle device I/F 7660 may establish wireless connection using a wireless communication protocol such as wireless LAN, Bluetooth (registered trademark), near field communication (NFC), or wireless USB (WUSB). In addition, the in-vehicle device I/F 7660 may establish wired connection by universal serial bus (USE), high-definition multimedia interface (HDMI) (registered trademark), mobile high-definition link (MHL), or the like via a connection terminal (and a cable if necessary) not shown in the figures. The in-vehicle device 7760 may, for example, include at least one of a mobile device or a wearable device carried by an occupant or an information device carried into or attached to the vehicle. The in-vehicle device 7760 may also include a navigation device that searches for a route to a destination of choice. The in-vehicle device I/F 7660 exchanges control signals or data signals with these in-vehicle devices 7760.

The in-vehicle network I/F 7680 is an interface that mediates communication between the microcomputer 7610 and the communication network 7010. The in-vehicle network I/F 7630 transmits and receives signals or the like in conformity with a predetermined protocol supported by the communication network 7010.

The microcomputer 7610 of the integrated control unit 7600 controls the vehicle control system 7000 in accordance with various kinds of programs on the basis of information obtained via at least one of the general-purpose communication I/F 7620, the dedicated communication I/F 7630, the positioning section 7640, the beacon receiver 7650, the in-vehicle device I/F 7660, or the in-vehicle network I/F 7680. For example, the microcomputer 7610 may calculate a control target value for the driving force generating device, the steering mechanism, or the braking device on the basis of the obtained information about the inside and outside of the vehicle, and output a control command to the drive system control unit 7100. For example, the microcomputer 7610 may perform cooperative control intended to implement functions of an advanced driver assistance system (ADAS) which include collision avoidance or shock mitigation for the vehicle, following driving based on distance between vehicles, vehicle speed maintaining driving, a warning of collision of the vehicle, a warning of departure of the vehicle from a lane, or the like. In addition, the microcomputer 7610 may perform cooperative control intended for automatic driving, which makes the vehicle to travel autonomously without relying on the operation of the driver, or the like, by controlling the driving force generating device, the steering mechanism, the braking device, or the like on the basis of the obtained information about the surrounding situation of the vehicle.

The microcomputer 7610 may generate three-dimensional distance information between the vehicle and an object, such as a structure or a person, around the vehicle, and generate local map information including information about the surrounding situation of the current position of the vehicle, on the basis of information obtained via at least one of the general-purpose communication I/F 7620, the dedicated communication I/F 7630, the positioning section 7640, the beacon receiver 7650, the in-vehicle device I/F 7660, or the in-vehicle network I/F 7630. In addition, the microcomputer 7610 may predict danger such as collision of the vehicle, approaching of a pedestrian or the like, an entry to a closed road, or the like, on the basis of the obtained information, and generate a warning signal. The warning signal may be, for example, a signal for producing a warning sound or lighting a warning lamp.

The sound/image output section 7670 transmits an output signal of at least one of a sound or an image to an output device capable of visually or auditorily giving information to an occupant of the vehicle or the outside of the vehicle. In the example of FIG. 14, an audio speaker 7710, a display section 7720, and an instrument panel 7730 are illustrated as the output device. The display section 7720 may include, for example, at least one of an on-board display or a head-up display. The display section 7720 may have an augmented reality (AR) display function. The output device may be a device other than these devices. For example, the output device may be a wearable device such as headphones or an eyeglass type display worn by an occupant, a projector, a lamp, or the like. In a case where the output device is a display device, the display device visually displays results obtained by various kinds of processing performed by the microcomputer 7610 or information received from another control unit in various forms such as text, an image, a table, or a graph. In addition, in a case where the output device is an audio output device, the audio output device converts an audio signal constituted of reproduced audio data or sound data or the like into an analog signal, and auditorily outputs the analog signal.

Note that at least two control units connected to each other via the communication network 7010 in the example shown in FIG. 14 may be integrated into one control unit. Alternatively, each individual control unit may include a plurality of control units. Further, the vehicle control system 7000 may include another control unit not shown in the figures. Furthermore, part or the whole of the functions performed by one of the control units in the above description may be assigned to another control unit. That is, predetermined arithmetic processing may be performed by any of the control units as long as information is transmitted and received via the communication network 7010. Similarly, a sensor or a device connected to one of the control units may be connected to another control unit, and a plurality of control units may mutually transmit and receive detection information via the communication network 7010.

The technology according to the present disclosure is applicable to, for example, the imaging section in the vehicle external information detection unit in the configuration described above.

[Others]

While the embodiments of the present disclosure have been specifically described above, the present disclosure is not limited to the above-described embodiments, and various modifications based on the technical concept of the present disclosure are possible. For example, the numerical values, structures, substrates, raw materials, processes, and the like described in the above embodiments are merely examples, and different numerical values, structures, substrates, raw materials, processes, and the like may be used as necessary.

It is to be noted that the technology of the present disclosure may have the following configurations.

[A1]

An imaging element including:

a photoelectric conversion unit that outputs an image signal according to received light; and a bonding pad section, the photoelectric conversion unit and the bonding pad section being disposed on one surface side of a substrate, in which the bonding pad section has at least a first opening provided to expose a pad electrode at a bottom, and a second opening that is arranged to surround the first opening and that is shallower than the first opening, and a surface of a terrace in the bonding pad section is formed such that multiple types of materials are exposed.

[A2]

The imaging element according to [A1] described above, in which the surface of the terrace in the bonding pad section is formed such that the multiple types of materials having different refractive indexes are exposed.

[A3]

The imaging element according to [A1] or [A2] described above, in which at least one of the multiple types of materials is exposed in a spaced dot pattern on the surface of the terrace in the bonding pad section.

[A4]

The imaging element according to [A1] or [A2] described above, in which at least one of the multiple types of materials is exposed in a spaced line pattern on the surface of the terrace in the bonding pad section.

[A5]

The imaging element according to [A1] or [A2] described above, in which at least one of the multiple types of materials is exposed in a matrix pattern on the surface of the terrace in the bonding pad section.

[A6]

The imaging element according to any one of [A1] to [A5] described above, in which a portion where the multiple types of materials are exposed is formed to have different heights for each material on the surface of the terrace in the bonding pad section.

[A7]

The imaging element according to [A6] described above, in which the portion where the multiple types of materials are exposed is formed such that a portion having a low refractive index protrudes on the surface of the terrace in the bonding pad section.

[A8]

The imaging element according to [A6] described above, in which the portion where the multiple types of materials are exposed is formed such that a portion having a high refractive index protrudes on the surface of the terrace in the bonding pad section.

[A9]

The imaging element according to any one of to [A8] described above, in which the substrate includes a semiconductor material layer, and a portion including a semiconductor material layer and a portion including a material different from a material constituting the semiconductor material layer are formed to be exposed on the surface of the terrace in the bonding pad section.

[A10]

The imaging element according to [A9] described above, in which the semiconductor material layer includes a silicon layer, and a portion including the silicon layer, a portion including silicon oxide, and/or a portion including silicon nitride is formed to be exposed on the surface of the terrace in the bonding pad section.

[B1]

A method for manufacturing an imaging element that includes a photoelectric conversion unit that outputs an image signal according to received light and a bonding pad section, the photoelectric conversion unit and the bonding pad section being disposed on one surface side of a substrate, the bonding pad section having at least a first opening provided to expose a pad electrode at a bottom, and a second opening that is arranged to surround the first opening and that is shallower than the first opening, the method including:

a step of placing the photoelectric conversion unit to be provided in a semiconductor material layer on the substrate;

a step of forming a trench in a portion of the semiconductor material layer corresponding to the second opening;

a step of embedding a material different from a material constituting the semiconductor material layer in the trench in the semiconductor material layer;

a step of forming the first opening; and a step of forming the second opening.

[B2]

The method for manufacturing an imaging element according to [B1] described above, further including a step of thinning a surface of the semiconductor material layer on a side of a photodiode that constitutes the photoelectric conversion unit after the photoelectric conversion unit is formed in the semiconductor material layer.

[B3]

The method for manufacturing an imaging element according to [B2] described above, in which the step of forming a trench in a portion of the semiconductor material layer corresponding to the second opening and the step of embedding a material different from a material constituting the semiconductor material layer in the trench of the semiconductor material layer are performed after the step of thinning the surface of the semiconductor material layer.

[B4]

The method for manufacturing an imaging element according to [B2] described above, in which the step of forming a trench in a portion of the semiconductor material layer corresponding to the second opening and the step of embedding a material different from a material constituting the semiconductor material layer in the trench of the semiconductor material layer are performed before the step of thinning the surface of the semiconductor material layer.

[C1]

An electronic device including an imaging element, in which the imaging element includes a photoelectric conversion unit that outputs an image signal according to received light and a bonding pad section, the photoelectric conversion unit and the bonding pad section being disposed on one surface side of a substrate, the bonding pad section has at least a first opening provided to expose a pad electrode at a bottom, and a second opening that is arranged to surround the first opening and that is shallower than the first opening, and a surface of a terrace in the bonding pad section is formed such that multiple types of materials are exposed.

[C2]

The electronic device according to [C1] described above, in which the surface of the terrace in the bonding pad section is formed such that the multiple types of materials having different refractive indexes are exposed.

[C3]

The electronic device according to [C1] or [C2] described above, in which at least one of the multiple types of materials is exposed in a spaced dot pattern on the surface of the terrace in the bonding pad section.

[C4]

The electronic device according to [C1] or [C2] described above, in which at least one of the multiple types of materials is exposed in a spaced line pattern on the surface of the terrace in the bonding pad section.

[C5]

The electronic device according to [C1] or described above, in which at least one of the multiple types of materials is exposed in a matrix pattern on the surface of the terrace in the bonding pad section.

[C6]

The electronic device according to any one of [C1] to [C5] described above, in which a portion where the multiple types of materials are exposed is formed to have different heights for each material on the surface of the terrace in the bonding pad section.

[C7]
The electronic device according to [C6] described above, in which the portion where the multiple types of materials are exposed is formed such that a portion having a low refractive index protrudes on the surface of the terrace in the bonding pad section.

[C8]
The electronic device according to [C6] described above, in which the portion where the multiple types of materials are exposed is formed such that a portion having a high refractive index protrudes on the surface of the terrace in the bonding pad section.

[C9]
The electronic device according to any one of [C1] to [C8] described above,
in which the substrate includes a semiconductor material layer, and
a portion including a semiconductor material layer and a portion including a material different from a material constituting the semiconductor material layer are formed to be exposed on the surface of the terrace in the bonding pad section.

[C10]
The electronic device according to [c9] described above,
in which the semiconductor material layer includes a silicon layer, and
a portion including the silicon layer, a portion including silicon oxide, and/or a portion including silicon nitride is formed to be exposed on the surface of the terrace in the bonding pad section.

REFERENCE SIGNS LIST

1 Imaging element
10 Substrate
11 Insulating layer
12 Pad electrode
13 Semiconductor material layer
14 Material different from semiconductor material
20 Photoelectric conversion unit
21 Pixel
30 Surrounding region
40 Bonding pad section
41 First opening
42 Second opening
50, 60 Guard ring
110 Package substrate
111 Terminal
120 Wire
130 Sealing material
140 Seal glass

What is claimed is:

1. An imaging element comprising:
a photoelectric conversion unit that outputs an image signal according to received light; and a bonding pad section, the photoelectric conversion unit and the bonding pad section being disposed on one surface side of a substrate,
wherein the bonding pad section has at least
a first opening provided to expose a pad electrode at a bottom, and
a second opening that is arranged to surround the first opening and that is shallower than the first opening, and
a surface of a terrace in the bonding pad section is formed such that multiple types of materials are exposed.

2. The imaging element according to claim 1,
wherein the surface of the terrace in the bonding pad section is formed such that the multiple types of materials having different refractive indexes are exposed.

3. The imaging element according to claim 1,
wherein at least one of the multiple types of materials is exposed in a spaced dot pattern on the surface of the terrace in the bonding pad section.

4. The imaging element according to claim 1,
wherein at least one of the multiple types of materials is exposed in a spaced line pattern on the surface of the terrace in the bonding pad section.

5. The imaging element according to claim 1,
wherein at least one of the multiple types of materials is exposed in a matrix pattern on the surface of the terrace in the bonding pad section.

6. The imaging element according to claim 1,
wherein a portion where the multiple types of materials are exposed is formed to have different heights for each material on the surface of the terrace in the bonding pad section.

7. The imaging element according to claim 6,
wherein the portion where the multiple types of materials are exposed is formed such that a portion having a low refractive index protrudes on the surface of the terrace in the bonding pad section.

8. The imaging element according to claim 6,
wherein the portion where the multiple types of materials are exposed is formed such that a portion having a high refractive index protrudes on the surface of the terrace in the bonding pad section.

9. The imaging element according to claim 1,
wherein the substrate includes a semiconductor material layer, and
a portion including a semiconductor material layer and a portion including a material different from a material constituting the semiconductor material layer are formed to be exposed on the surface of the terrace in the bonding pad section.

10. The imaging element according to claim 9,
wherein the semiconductor material layer includes a silicon layer, and
a portion including the silicon layer, a portion including silicon oxide, and/or a portion including silicon nitride is formed to be exposed on the surface of the terrace in the bonding pad section.

11. A method for manufacturing an imaging element that includes
a photoelectric conversion unit that outputs an image signal according to received light and a bonding pad section, the photoelectric conversion unit and the bonding pad section being disposed on one surface side of a substrate,
the bonding pad section having at least
a first opening provided to expose a pad electrode at a bottom, and
a second opening that is arranged to surround the first opening and that is shallower than the first opening, the method comprising:
a step of placing the photoelectric conversion unit to be provided in a semiconductor material layer on the substrate;
a step of forming a trench in a portion of the semiconductor material layer corresponding to the second opening;

a step of embedding a material different from a material constituting the semiconductor material layer in the trench in the semiconductor material layer;

a step of forming the first opening; and a step of forming the second opening.

12. The method for manufacturing an imaging element according to claim 11, further comprising:

a step of thinning a surface of the semiconductor material layer on a side of a photodiode that constitutes the photoelectric conversion unit after the photoelectric conversion unit is formed in the semiconductor material layer.

13. The method for manufacturing an imaging element according to claim 12, wherein the step of forming a trench in a portion of the semiconductor material layer corresponding to the second opening and the step of embedding a material different from a material constituting the semiconductor material layer in the trench of the semiconductor material layer are performed after the step of thinning the surface of the semiconductor material layer.

14. The method for manufacturing an imaging element according to claim 12, wherein the step of forming a trench in a portion of the semiconductor material layer corresponding to the second opening and the step of embedding a material different from a material constituting the semiconductor material layer in the trench of the semiconductor material layer are performed before the step of thinning the surface of the semiconductor material layer.

15. An electronic device comprising an imaging element, wherein the imaging element includes a photoelectric conversion unit that outputs an image signal according to received light and a bonding pad section, the photoelectric conversion unit and the bonding pad section being disposed on one surface side of a substrate, the bonding pad section has at least a first opening provided to expose a pad electrode at a bottom, and a second opening that is arranged to surround the first opening and that is shallower than the first opening, and a surface of a terrace in the bonding pad section is formed such that multiple types of materials are exposed.

* * * * *